(12) United States Patent
Do et al.

(10) Patent No.: US 9,048,228 B2
(45) Date of Patent: Jun. 2, 2015

(54) INTEGRATED CIRCUIT PACKAGING SYSTEM WITH SIDE SOLDERABLE LEADS AND METHOD OF MANUFACTURE THEREOF

(71) Applicants: Byung Tai Do, Singapore (SG); Emmanuel Espiritu, Singapore (SG); Allan P. Ilagan, Singapore (SG); Marites Laguipo Roque, Singapore (SG)

(72) Inventors: Byung Tai Do, Singapore (SG); Emmanuel Espiritu, Singapore (SG); Allan P. Ilagan, Singapore (SG); Marites Laguipo Roque, Singapore (SG)

(73) Assignee: STATS ChipPAC Ltd., Singapore (SG)

( * ) Notice: Subject to any disclaimer, the term of this patent is extended or adjusted under 35 U.S.C. 154(b) by 63 days.

(21) Appl. No.: 14/037,838

(22) Filed: Sep. 26, 2013

(65) Prior Publication Data

US 2015/0084172 A1    Mar. 26, 2015

(51) Int. Cl.
*H01L 23/495* (2006.01)
*H01L 23/00* (2006.01)

(52) U.S. Cl.
CPC .......... *H01L 23/49517* (2013.01); *H01L 24/96* (2013.01)

(58) Field of Classification Search
USPC ............. 438/112, 111, 113, 114, 109, 83, 98, 438/100, 101, 123, 124, 411, 412, 461, 584, 438/597–688, 15, 25, 26, 51, 55, 64–67, 438/126, 127; 257/E21.499, E51.705, 41, 257/81, 82, 91, 99, 177–182, 257/E21.502–E21.504, E21.705, 276, 457, 257/459, 502, 503, 573, 584, 602, 621, 257/664–677, 688–700, 734–786, 257/E23.01–E23.079, E23.141–E23.179, 257/E23.031–E23.059
See application file for complete search history.

(56) References Cited

U.S. PATENT DOCUMENTS

| | | | |
|---|---|---|---|
| 6,452,255 B1 * | 9/2002 | Bayan et al. | 257/666 |
| 6,501,161 B1 | 12/2002 | Lee | |
| 6,608,366 B1 | 8/2003 | Fogelson et al. | |
| 6,611,047 B2 | 8/2003 | Hu et al. | |
| 6,872,599 B1 | 3/2005 | Li et al. | |
| 7,008,825 B1 * | 3/2006 | Bancod et al. | 438/123 |
| 7,195,953 B2 | 3/2007 | Shirasaka | |
| 7,264,997 B2 | 9/2007 | Kameyama et al. | |
| 7,655,506 B2 | 2/2010 | Tabira | |
| 8,329,509 B2 * | 12/2012 | Gong et al. | 438/112 |
| 8,809,119 B1 * | 8/2014 | Espiritu et al. | 438/112 |
| 2007/0246810 A1 * | 10/2007 | Retuta et al. | 257/678 |
| 2009/0057855 A1 * | 3/2009 | Quinones et al. | 257/676 |
| 2010/0133693 A1 * | 6/2010 | Arshad | 257/762 |
| 2011/0033977 A1 | 2/2011 | Huening | |
| 2011/0221051 A1 * | 9/2011 | Sirinorakul | 257/676 |
| 2012/0108013 A1 | 5/2012 | Fujisawa et al. | |
| 2013/0049180 A1 | 2/2013 | Xu et al. | |
| 2013/0127029 A1 * | 5/2013 | Lee et al. | 257/675 |

* cited by examiner

*Primary Examiner* — Dao H Nguyen
*Assistant Examiner* — Tram H Nguyen
(74) *Attorney, Agent, or Firm* — Ishimaru & Associates LLP

(57) ABSTRACT

A system and method of manufacture of an integrated circuit packaging system includes: a leadframe having a side solderable lead with a half-etched lead portion and a lead top side; a mold body directly on the leadframe and the side solderable lead, the lead top side of the side solderable lead exposed from the mold body; a mold groove in the mold body and in a portion of the side solderable lead for exposing a lead protrusion of the side solderable lead on an upper perimeter side of the mold body; and the half-etched lead portion exposed from a lower perimeter side of the mold body.

20 Claims, 13 Drawing Sheets

INTEGRATED CIRCUIT PACKAGING SYSTEM WITH SIDE SOLDERABLE LEADS AND METHOD OF MANUFACTURE THEREOF

TECHNICAL FIELD

The present invention relates generally to an integrated circuit packaging system, and more particularly to a system with side solderable leads.

BACKGROUND ART

Modern electronics, such as smart phones, tablet computers, location based services devices, enterprise class servers, or enterprise class storage arrays, are packing more integrated circuits into an ever-shrinking physical space with expectations for decreasing cost. Numerous technologies have been developed to meet these requirements. Research and development strategies focus on new technologies as well as on improving the existing and mature technologies. Research and development in the existing technologies can take a myriad of different directions.

Modern electronics requirements demand increased functionality in an integrated circuit package while providing less physical space in the system. While these approaches provide more functions within an integrated circuit, they do not fully address the requirements for lower height, smaller space, and cost reduction.

One way to reduce cost is to use mature package technologies with existing manufacturing methods and equipment. The reuse of existing manufacturing processes does not typically result in the reduction of package dimensions. The demand still continues for lower cost, smaller size, improved connectivity, and more functionality.

Thus, a need still remains for an integrated circuit packaging system including lower cost, smaller size, and more functionality. In view of the ever-increasing need to improve integration and cost reduction, it is increasingly critical that answers be found to these problems. Ever-increasing commercial competitive pressures, along with growing consumer expectations, make it critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a leadframe having a side solderable lead with a half-etched lead portion and a lead top side; forming a mold body directly on the leadframe and the side solderable lead, the lead top side of the side solderable lead exposed from the mold body; removing a portion of the mold body and a portion of the side solderable lead for forming a mold groove in the mold body to expose a lead protrusion of the side solderable lead on an upper perimeter side of the mold body; and singulating the mold body and the leadframe for exposing the half-etching lead portion from a lower perimeter side of the mold body.

The present invention provides an integrated circuit packaging system including: a leadframe having a side solderable lead with a half-etched lead portion and a lead top side; a mold body directly on the leadframe and the side solderable lead, the lead top side of the side solderable lead exposed from the mold body; a mold groove in the mold body and in a portion of the side solderable lead for exposing a lead protrusion of the side solderable lead on an upper perimeter side of the mold body; and the half-etching lead portion exposed from a lower perimeter side of the mold body.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1:
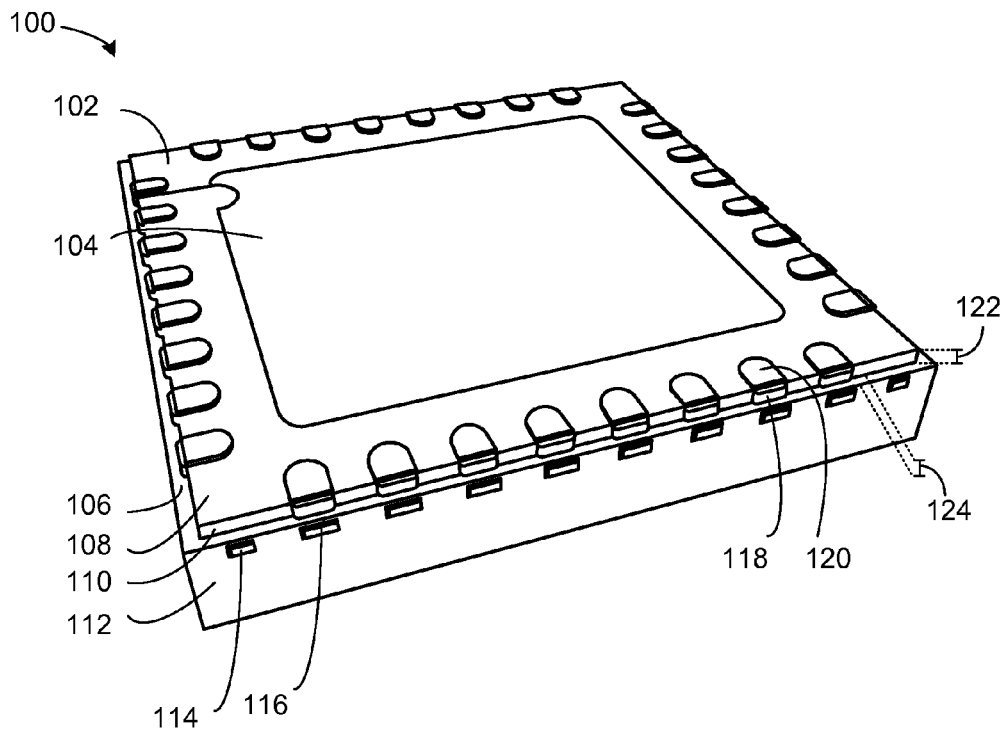
FIG. 1 is an isometric view of an integrated circuit packaging system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

The term "processing" as used herein includes deposition of material or photoresist, patterning, exposure, development, etching, ablating, grinding, buffing, cleaning, and/or removal of the material or photoresist as required in forming a described structure.

For expository purposes, the term "horizontal" as used herein is defined as a plane parallel to the active side of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" means that there is direct contact between elements. The term "directly on" means that there is direct contact between one element and another element without an intervening element.

Referring now to FIG. 1, therein is shown an isometric view of an integrated circuit packaging system 100 in a first embodiment of the present invention. The integrated circuit packaging system 100 can include a mold body 102 and a die paddle 104. For example, the integrated circuit packaging system 100 can include a Quad Flat No Lead (QFN) package, a Quad Flat No Lead side solderable (QFNs-ss) package, or other similar package.

The mold body 102 is a structural support element. The mold body 102 can be formed from a molding compound, epoxy, resin, polymer, or a combination thereof.

The die paddle 104 is a structural element for supporting a die (not shown). The die paddle 104 can be formed from a metal, alloy, or a combination thereof. The die paddle 104 can be thermally conductive for dissipating heat generated by the die.

The mold body 102 can include a mold step 106. The mold step 106 is a structural element. The mold step 106 can be formed by removing a portion of the mold body 102 around the top perimeter of the mold body 102.

The mold body 102 can include a mold body top side 108. The perimeter of the mold body top side 108 is set back from the lower portion of the mold body 102.

The mold body top side 108 is coplanar with the top side of the die paddle 104. The die paddle 104 is exposed from the mold body 102 at the mold body top side 108.

The mold body 102 can include an upper perimeter side 110. The upper perimeter side 110 is the non-horizontal side of the upper portion of the mold body 102. The mold body 102 can include a lower perimeter side 112. The lower perimeter side 112 is the non-horizontal die of the lower portion of the mold body 102. The lower perimeter side 112 is separated from the upper perimeter side 110 by the mold step 106.

The upper perimeter side 110 is separated from the mold step 106 by a mold step height 122. The upper perimeter side 110 is set back from the lower perimeter side 112 by a mold step width 124.

The integrated circuit packaging system 100 can include a side dambar lead 114. The side dambar lead 114 is a conductive structure exposed on the lower perimeter side 112.

The integrated circuit packaging system 100 can include a half-etched lead portion 116. The half-etched lead portion 116 is a conductive element exposed on the lower perimeter side 112.

The integrated circuit packaging system 100 can include a side solderable lead 118. The side solderable lead 118 is an electrical conductor for forming a conductive path to an external element (not shown). The side solderable lead 118 can extend out from the upper perimeter side 110 and onto the mold step 106. The side solderable lead 118 can provide an electrical connection in the horizontal direction.

The side solderable lead 118 can include a lead top side 120. The lead top side 120 is the top side of the side solderable lead 118. The lead top side 120 is exposed on the mold body top side 108 and coplanar with the mold body top side 108. The lead top side 120 provides a conductive contact at the mold body top side 108.

The side solderable lead 118 can include the half-etched lead portion 116. The half-etched lead portion 116 is a conductive element electrically connected to the side solderable lead 118. The half-etched lead portion 116 is at the bottom portion of the side solderable lead 118.

It has been found that forming the side solderable lead 118 on the upper perimeter side 110 of the mold body 102 increases and simplifies connectivity. The side solderable lead 118 having the lead top side 120 exposed on the mold body top side 108 provide additional surface area for forming solder connections for increasing connectivity.

It has been found that forming the mold step 106 adjacent to the side solderable lead 118 can increase manufacturing yield and reduce short circuits. The mold step 106 can prevent the flow of solder from the side solderable lead 118 by providing a platform to support the solder connection to the side solderable lead 118.

It has been found that forming the side dambar lead 114 on the lower perimeter side 110 can increase operational performance. The side dambar lead 114 can provide a path for providing power or ground voltages. The side dambar lead 114 can provide a thermal connection for dissipating heat to an external system.

Figure 2:
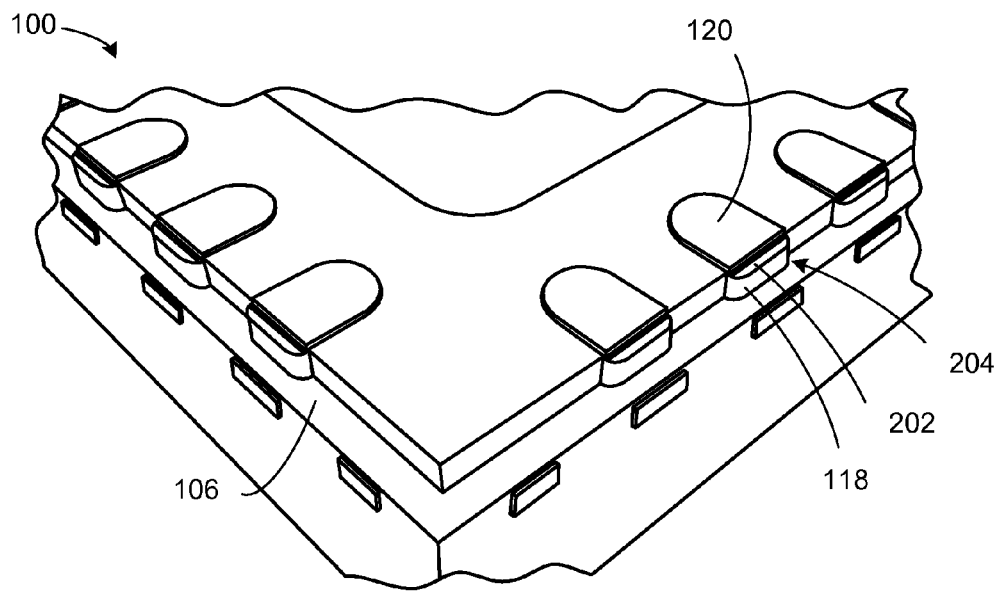
FIG. 2 is a close up view of the integrated circuit packaging system of FIG. 1.

Referring now to FIG. 2, therein is shown a close up view of the integrated circuit packaging system of FIG. 1. The integrated circuit packaging system 100 can include the side solderable lead 118.

The side solderable lead 118 can include a lead step 202 in a lead protrusion 204. The lead protrusion 204 is a portion of the side solderable lead 118 extending over the mold step 106 to provide lateral connectivity. For example, the lead protrusion 204 can form a side solder connection with an external system (not shown).

The lead step 202 is a portion of the side solderable lead 118 set back from the lead top side 120. The lead step 202 can provide additional surface area for forming a solder connection at the lead protrusion 204 of the side solderable lead 118. The lead step 202 is at the top of the lead protrusion 204.

It has been discovered that forming the lead step 202 on the lead protrusion 204 of the side solderable lead 118 increases the conductivity of the connection to the side solderable lead 118. Forming the lead step 202 on the side solderable lead 118 increases the amount of surface area for forming a solder connection on the side solderable lead 118 and increases the overall conductivity of the solder connection.

Figure 3:
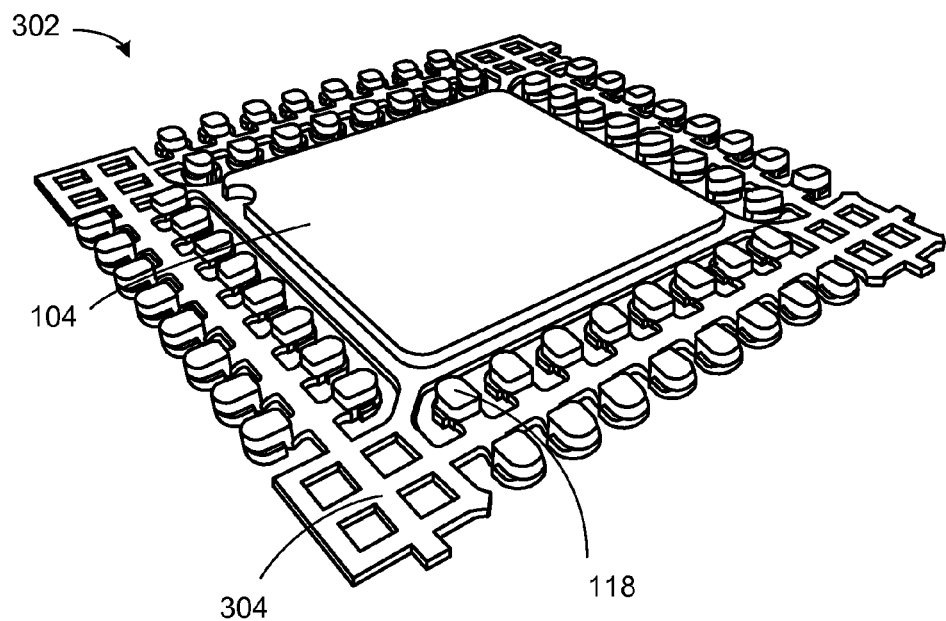
FIG. 3 is the structure of FIG. 1 in a provisioning phase of manufacturing.

Referring now to FIG. 3, therein is shown the structure of FIG. 1 in a provisioning phase of manufacturing. The provisioning phase can include a forming method to form a leadframe 302. The leadframe 302 is a structure having conductive elements. The leadframe 302 can include the die paddle 104 coupled to a dambar 304 and the side solderable lead 118. The dambar 304 is a conductive structural element. For example, the leadframe 302 can be formed with copper, tin, gold, other metals, alloys, or a combination thereof.

Figure 4:
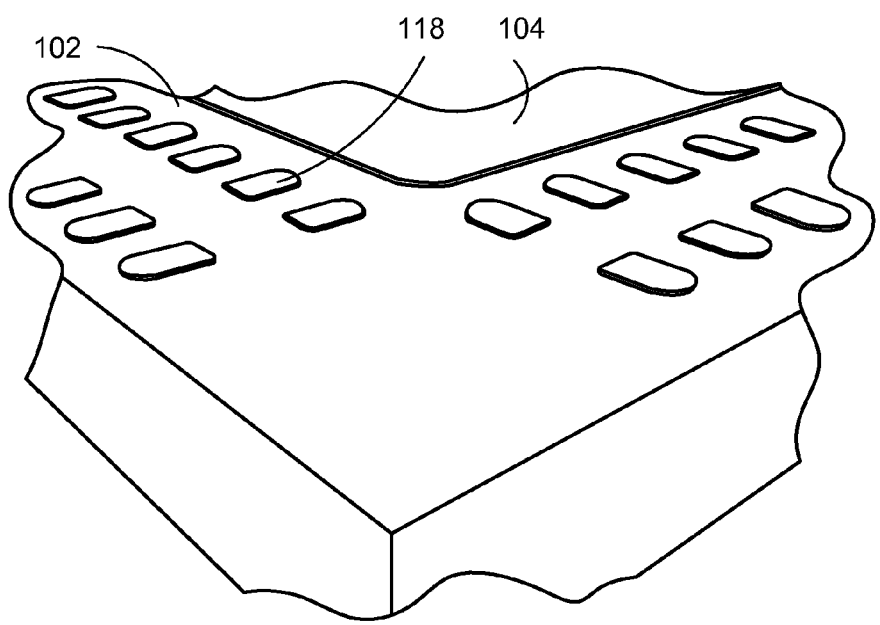
FIG. 4 is the structure of FIG. 3 in a molding phase of manufacturing.

Referring now to FIG. 4, therein is shown the structure of FIG. 3 in a molding phase of manufacturing. The molding phase can include a molding method to form the mold body 102. The mold body 102 can be formed from an insulating material such as a molding compound, a resin, epoxy, polymer, or a combination thereof.

The mold body 102 is formed directly on the leadframe 302 of FIG. 3. The mold body 102 can expose the die paddle 104 and the top side of the side solderable lead 118.

Figure 5:
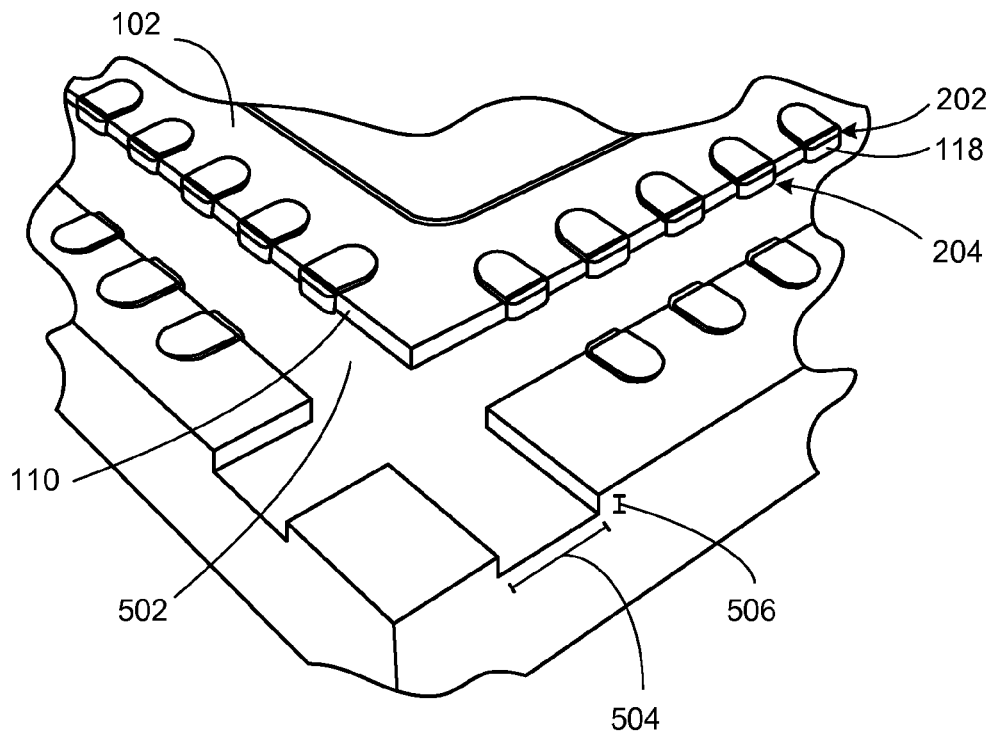
FIG. 5 is the structure of FIG. 4 in a removal phase of manufacturing.

Referring now to FIG. 5, therein is shown the structure of FIG. 4 in a removal phase of manufacturing. The removal phase can include a removal method to form a mold groove 502 in the mold body 102 and to shape and expose the side solderable lead 118 and the lead protrusion 204.

The mold groove 502 is an opening in the mold body 102. The mold groove 502 can be formed between two directly adjacent rows of the side solderable lead 118 on the leadframe 302 of FIG. 3.

The mold groove 502 can have a groove width 504. The groove width 504 can be the distance between the opposite sides of the mold groove 502. The groove width 504 can be the distance between facing surfaces of adjacent rows of the side solderable lead 118.

The mold groove 502 can have a groove depth 506. The groove depth 506 is a value indicating how far into the mold body 102 the mold groove 502 extends. The mold groove 502 can be configured such that the groove depth 506 is sufficient to expose the upper portions of the side solderable lead 118 but not expose the half-etched lead portion 116 of FIG. 1. For example, the laser ablation removal method can have a laser ablation depth target of 75-125 micrometers (μm).

The mold groove 502 can form the upper perimeter side 110 and the mold step 106 of FIG. 1. The mold groove 502 can be formed having depth equal to the mold step height 122 of FIG. 1. The mold groove 502 can be formed with a single channel, double channels, or a combination thereof. The mold groove 502 can include a double channel having a central divider.

The mold groove 502 is formed by removing a portion of the mold body 102 to expose a portion of the side solderable lead 118. The side solderable lead 118 can be exposed on the upper perimeter side 110 of the mold body 102.

Forming the mold groove 502 can also include removing a portion of the side solderable lead 118. Forming the mold groove 502 can include shaping a portion of the side solderable lead 118.

The mold groove 502 can be formed in a variety of ways. For example, the mold groove 502 can be formed by laser ablation, etching, or a combination thereof.

The removal method of laser ablation can direct a laser along a path to selectively ablate portions of the mold body 102 to form the mold groove 502. The laser can remove portions of the mold body 102 and portions of the side solderable lead 118.

The mold groove 502 can have the physical characteristics of being formed by laser ablation including burn marks, melted portions, sputter marks, or combination thereof. Forming the mold groove 502 by laser ablation can provide a surface that is more uniform and smoother than other methods. The fine grain control of laser beam size, intensity, optical frequency, pulse width, and positional control, laser ablation can form the mold groove 502 with the desired properties and physical configuration.

The laser can make one or more passes along the path over the mold body 102 to form the mold groove 502. For example, the laser having a beam diameter can form the mold groove 502 in a single pass between adjacent rows of the side solderable lead 118 of the leadframe 302 resulting in a single groove pattern. In another example, the laser can make two passes along the facing sides of adjacent rows of the side solderable lead 118 to form the mold groove 502 having a double channel. The double channel configuration can include a central spine between the double channels.

Forming the mold groove 502 and exposing the side solderable lead 118 can be performed in a variety of ways. For example, the laser ablation removal method can employ a laser, such as a green laser (532 nanometer (nm) wavelength), an infrared laser, or other laser wavelength type. The laser can have a power intensity of approximately 9 watts (W).

The laser ablation removal method can employ a variety of configurations. For example, the laser can have a beam width of 0.05 millimeters (mm) when forming the mold groove 502 and a beam width of 0.08 mm when forming the mold groove 502 and the side solderable lead 118. In another example, the laser can have a beam width of 0.16 mm when forming the mold groove 502 and a beam width of 0.08 mm when forming the mold groove 502 and the side solderable lead 118.

The laser ablation removal method can shape and expose the side solderable lead 118 by selectively removing portions of the side solderable lead 118. The path of the laser can include one or more passes along the top edge of the side solderable lead 118 to ablate portions of the side solderable lead 118 for forming the side solderable lead 118 and the lead step 202 on the lead protrusion 204. For example, the laser can be directed at the top edge of the lead protrusion 204 of the side solderable lead 118 to form the lead step 202 with an offset from top of the side solderable lead 118.

The laser ablation removal method can form the shape of the side solderable lead 118. For example, the lead protrusion 204 extending over the mold step 106 can be rounded, three-sided, angular, or a combination thereof. The laser ablation removal method can be configured to provide the desired shape of the side solderable lead 118 and the lead protrusion 204.

The mold body 102 and the side solderable lead 118 have different physical properties, so the laser can be configured differently for forming the mold groove 502 and exposing the side solderable lead 118. For example, the laser can employ different power intensities, pulse modulation, beam size, repetition pattern, or a combination thereof when exposing and shaping the side solderable lead 118 than when forming other portions of the mold groove 502. In another example, the laser ablation process can be simplified and use the same laser configuration for forming the mold groove 502 and the side solderable lead 118.

The side solderable lead 118 can have the physical characteristics of being formed by laser ablation including burn marks, melted portions, sputter marks, or combination thereof. Shaping the side solderable lead 118 by laser ablation can provide a surface that is more uniform and smoother than other methods.

Because of the fine grain control of laser beam size, intensity, optical frequency, pulse width, and positional control, laser ablation can more expose and shape the side solderable lead 118 with the desired properties and physical configuration. For example, the laser can shape the lead protrusion 204 of the side solderable lead 118 to have a rounded convex protrusion for increasing the surface area of the side solderable lead 118 for improved connectivity and making more resilient solder connections.

It has been discovered that forming the mold groove 502 and the side solderable lead 118 with laser ablation provides increased reliability. The laser ablation process can form the mold groove 502 and the side solderable lead 118 without mechanical vibration and reduce the likelihood of component failure or physical damage due to vibration.

It has been discovered that forming the mold groove 502 and the side solderable lead 118 with laser ablation provides simplifies manufacturing and increases flexibility. The precise patterning provided by the laser ablation can form the mold groove 502 and the side solderable lead 118 having the desired shape by controlling the laser ablation parameters including path, intensity, beam size, and pulse modulation.

It has been discovered that forming the mold groove 502, the side solderable lead 118, and the lead step 202 with laser ablation provides simplifies manufacturing and increased yields. The laser ablation can form the mold groove 502, expose the side solderable lead 118, and form the lead step 202 in a single operation, thus reducing complexity.

It has been discovered that forming the side solderable lead 118 and the lead protrusion 204 with laser ablation provides improved reliability and increased yields. The laser ablation can form the lead protrusion 204 of the side solderable lead 118 with different convex shapes to increase the surface area available for forming a solder connection to increase conductivity and reduce the likelihood of joint failure.

Figure 6:
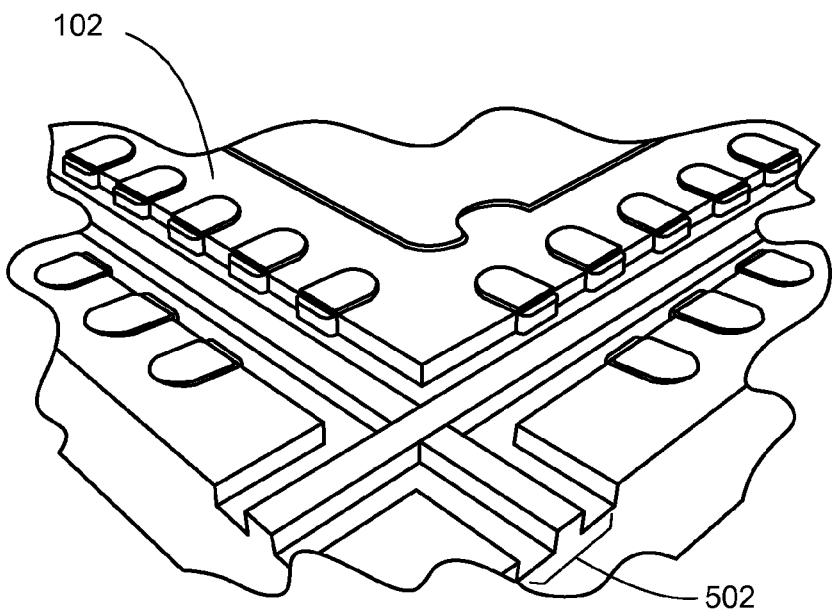
FIG. 6 is an alternative double channel pattern of removal in a cleaning phase of manufacturing.

Referring now to FIG. 6, therein is shown an alternative double channel pattern of removal in a cleaning phase of manufacturing. The cleaning phase can include a cleaning method to remove unwanted material resulting from the removal phase. In the double channel pattern, a portion of the encapsulation molding compound on the area of the dambar is not removed. The mold groove 502 can include the single channel or double channel configuration.

The cleaning phase can include a chemical deflash process to clean away and substantially remove residue from the removal process including spurs, ash, burrs, protrusions, or a combination thereof left in the mold groove 502. The chemical deflash process is a chemical cleaning and etching process for removing residue and smoothing the surface of the mold groove 502. For example, the chemical deflash process can remove small structural residue elements formed during the formation of the mold groove 502. The chemical deflash process can include solvents and high pressure liquid flow to remove the residue.

In an illustrative example, the laser ablation process can remove the resin component of the encapsulation molding compound forming the mold body 102 and leave portions of the encapsulation molding compound filler material. The chemical deflash process can substantially remove the remaining filler material. The chemical deflash process can remove portions of the encapsulation molding compound and filler material in the mold groove 502.

Figure 7:
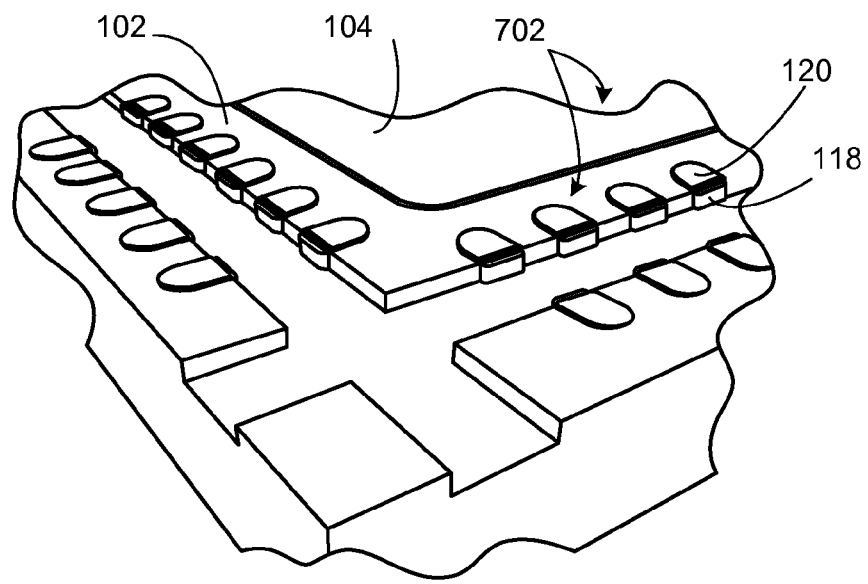
FIG. 7 is the structure of FIG. 5 in a plating phase of manufacturing.

Referring now to FIG. 7, therein is shown the structure of FIG. 5 in a plating phase of manufacturing. The plating phase can include a plating method to form a conductive layer on exposed surfaces of the side solderable lead 118 and the die paddle 104. The conductive layer can be formed on the side solderable lead 118, the lead top side 120, and the die paddle 104.

For example, the plating phase can form a plating layer 702 on all exposed copper surfaces exposed from the mold body 102. The plating layer 702 can be a conductive protective material for preventing corrosion, reducing ion migration, increasing conductivity, or a combination thereof.

The mold groove 502 of FIG. 5 can be configured in a variety of ways. For example, the mold groove 502 can include the single channel or double channel configuration. It is understood that the mold groove 502 can be implemented in either configuration.

Figure 8:
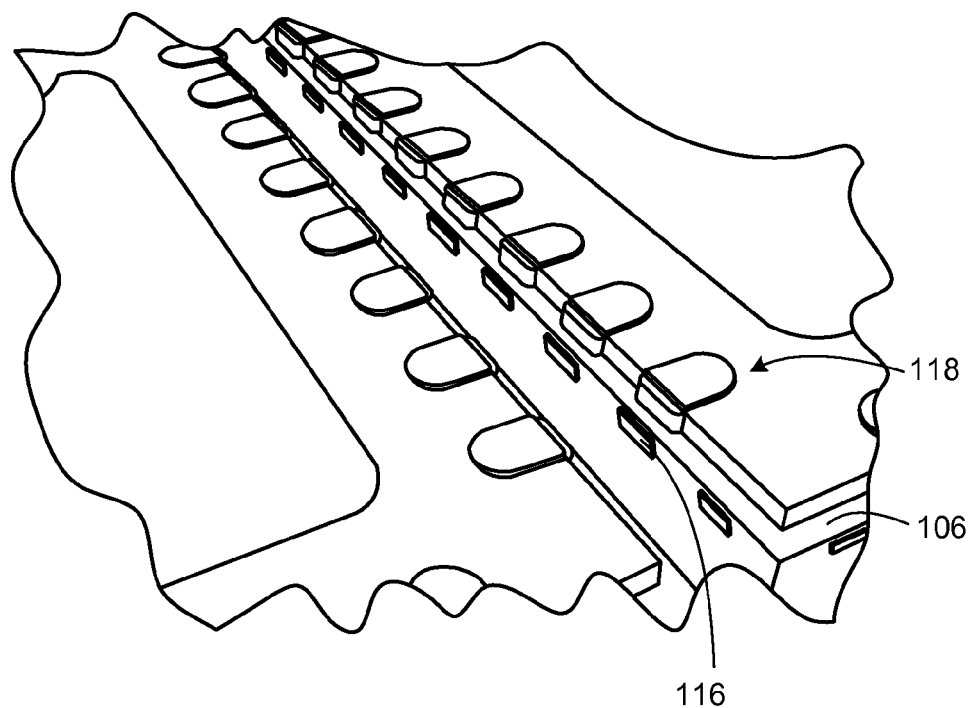
FIG. 8 is the structure of FIG. 7 in a singulation phase of manufacturing.

Referring now to FIG. 8, therein is shown the structure of FIG. 7 in a singulation phase of manufacturing. The singulation phase can include a singulation method to separate the integrated circuit packaging system 100 of FIG. 1 from an adjacent one of the integrated circuit packaging system 100.

The singulation method can separate the integrated circuit packaging system 100 from another of the integrated circuit packaging system 100 by cutting along the mold groove 502 of FIG. 5. The singulation method can expose the half-etched lead portion 116 of the side solderable lead 118 by cutting through the leadframe 302 of FIG. 3 including the dambar 304 of FIG. 3.

The singulation method can be implemented in a variety of ways. For example, the singulation method can include sawing, grinding, etching, ablating, or a combination thereof. In another example, the singulation method can include using a saw to cut through the middle portion of the mold groove 502. In yet another example, the singulation method can include using a laser cutter to remove the middle portion of the mold groove 502.

Singulating along the mold groove 502 of FIG. 5 can expose the half-etched lead portion 116 of the side solderable lead 118. The half-etched lead portion 116 can have the physical characteristics of being singulated. Singulating along the mold groove 502 forms the mold step 106.

For example, the half-etched lead portion 116 can include the physical characteristics of sawing including scratches aligned along the direction of motion of the saw, burrs, spurs, or a combination thereof. In another example, the half-etched lead portion 116 can have the physical characteristics of laser cutting including burn marks, spurs, protrusions, melted portions, or a combination thereof.

It has been discovered that forming the mold groove 502 with laser ablation improves singulation and helps reduce manufacturing errors. Forming the mold groove 502 simplifies package singulation by providing a guide for the singulation process.

Figure 9:
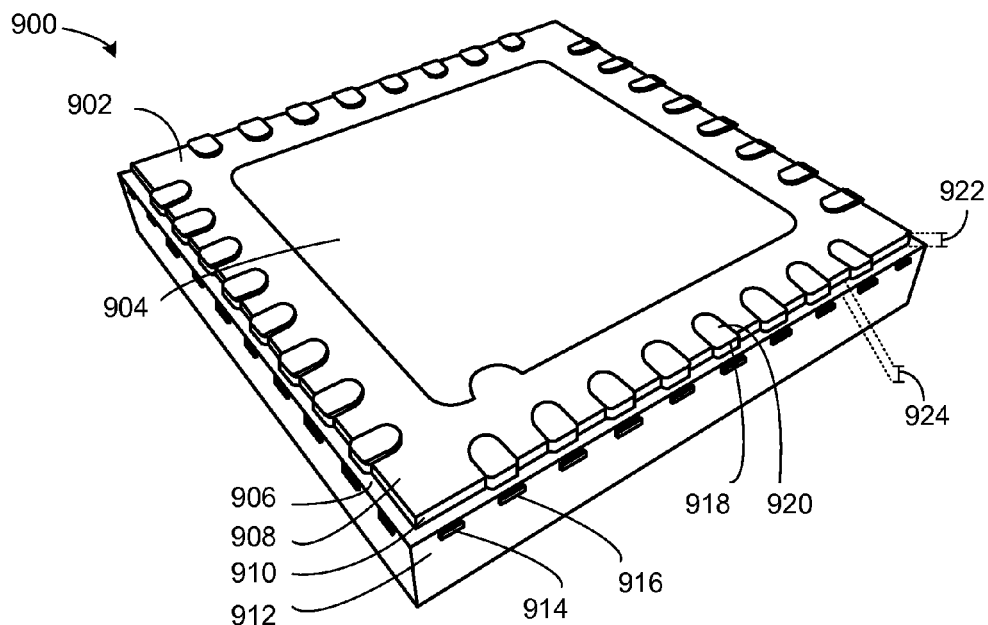
FIG. 9 is an isometric view of an integrated circuit packaging system in a second embodiment of the present invention.

Referring now to FIG. 9, therein is shown an isometric view of an integrated circuit packaging system 900 in a second embodiment of the present invention. The integrated circuit packaging system 900 can include a mold body 902 and a die paddle 904. For example, the integrated circuit packaging system 900 can include a Quad Flat No Lead (QFN) package, a Quad Flat No Lead side solderable (QFNsss) package, or other similar package.

The mold body 902 is a structural support element. The mold body 902 can be formed from a molding compound, epoxy, resin, polymer, or a combination thereof.

The die paddle 904 is a structural element for supporting a die (not shown). The die paddle 904 can be formed from a metal, alloy, or a combination thereof. The die paddle 904 can be thermally conductive for dissipating heat generated by the die.

The mold body 902 can include a mold step 906. The mold step 906 is a structural element. The mold step 906 can be formed by removing a portion of the mold body 902 around the top perimeter of the mold body 902.

The mold body 902 can include a mold body top side 908. The perimeter of the mold body top side 908 is set back from the lower portion of the mold body 902.

The mold body top side 908 is coplanar with the top side of the die paddle 904. The die paddle 904 is exposed from the mold body 902 at the mold body top side 908.

The mold body 902 can include an upper perimeter side 910. The upper perimeter side 910 is the non-horizontal side of the upper portion of the mold body 902. The mold body 902 can include a lower perimeter side 912. The lower perimeter side 912 is the non-horizontal die of the lower portion of the mold body 902. The lower perimeter side 912 is separated from the upper perimeter side 910 by the mold step 906.

The upper perimeter side 910 is separated from the mold step 906 by a mold step height 922. The upper perimeter side 910 is set back from the lower perimeter side 912 by a mold step width 924.

The integrated circuit packaging system 900 can include a side dambar lead 914. The side dambar lead 914 is a conductive structure exposed on the lower perimeter side 912.

The integrated circuit packaging system 900 can include a half-etched lead portion 916. The half-etched lead portion 916 is a conductive element exposed on the lower perimeter side 912.

The integrated circuit packaging system 900 can include a side solderable lead 918. The side solderable lead 918 is an electrical conductor for forming a conductive path to an external element (not shown). The side solderable lead 918 can extend out from the upper perimeter side 910 and onto the mold step 906. The side solderable lead 918 can provide an electrical connection in the horizontal direction.

The side solderable lead 918 can include a lead top side 920. The lead top side 920 is the top side of the side solderable lead 918. The lead top side 920 is exposed on the mold body top side 908 and coplanar with the mold body top side 908. The lead top side 920 provides a conductive contact at the mold body top side 908.

The side solderable lead 918 can include the half-etched lead portion 916. The half-etched lead portion 916 is a conductive element electrically connected to the side solderable lead 918. The half-etched lead portion 916 is at the bottom portion of the side solderable lead 918.

It has been found that forming the side solderable lead 918 on the upper perimeter side 910 of the mold body 902 increases and simplifies connectivity. The side solderable lead 918 having the lead top side 920 exposed on the mold body top side 908 provide additional surface area for forming solder connections for increasing connectivity.

It has been found that forming the mold step 906 adjacent to the side solderable lead 918 can increase manufacturing yield and reduce short circuits. The mold step 906 can prevent the flow of solder from the side solderable lead 918 by providing a platform to support the solder connection to the side solderable lead 918.

It has been found that forming the side dambar lead 914 on the lower perimeter side 910 can increase operational performance. The side dambar lead 914 can provide a path for providing power or ground voltages. The side dambar lead 914 can provide a thermal connection for dissipating heat to an external system.

Figure 10:
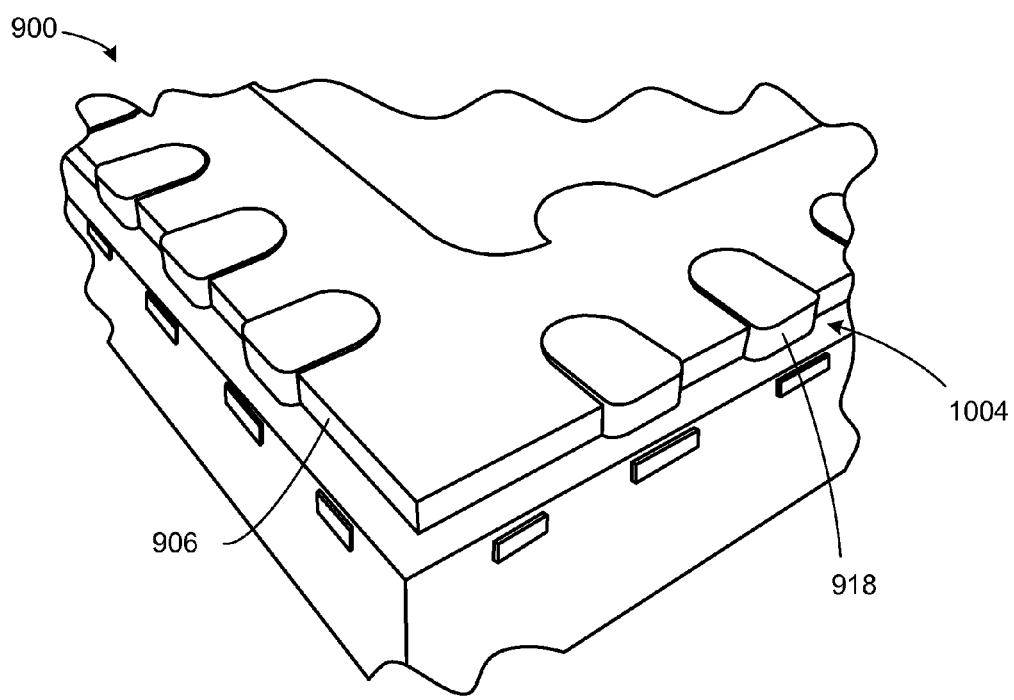
FIG. 10 is a close up view of the integrated circuit packaging system of FIG. 9.

Referring now to FIG. 10, therein is shown a close up view of the integrated circuit packaging system of FIG. 9. The integrated circuit packaging system 900 can include the side solderable lead 918.

The side solderable lead 918 can include a lead protrusion 1004. The lead protrusion 1004 is a portion of the side solderable lead 918 extending over the mold step 906 to provide lateral connectivity. For example, the lead protrusion 1004 can form a side solder connection with an external system (not shown).

It has been discovered that forming the lead protrusion 1004 of the side solderable lead 918 increases the conductivity of the connection to the side solderable lead 918. Forming the lead protrusion 1004 on the side solderable lead 918 increases the amount of surface area for forming a solder connection on the side solderable lead 918 and increases the overall conductivity of the solder connection.

Figure 11:
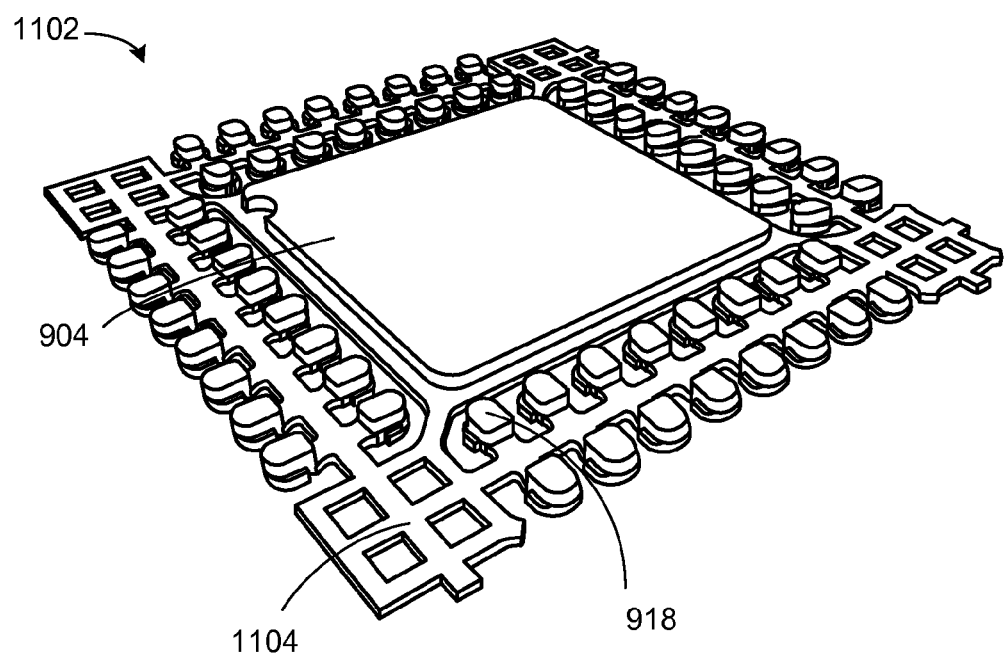
FIG. 11 is the structure of FIG. 9 in a provisioning phase of manufacturing.

Referring now to FIG. 11, therein is shown the structure of FIG. 9 in a provisioning phase of manufacturing. The provisioning phase can include a forming method to form a leadframe 1102. The leadframe 1102 is a structure having conductive elements. The leadframe 1102 can include the die paddle 904 coupled to a dambar 1104 and the side solderable lead 918. The dambar 1104 is a conductive structural element. For example, the leadframe 1102 can be formed with copper, tin, gold, other metals, alloys, or a combination thereof.

Figure 12:
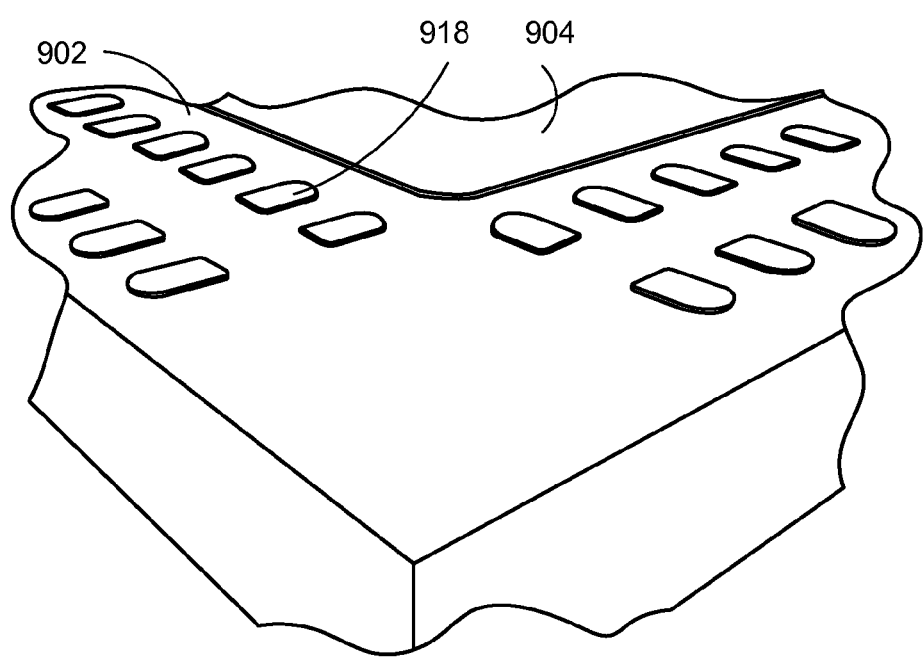
FIG. 12 is the structure of FIG. 11 in a molding phase of manufacturing.

Referring now to FIG. 12, therein is shown the structure of FIG. 11 in a molding phase of manufacturing. The molding phase can include a molding method to form the mold body 902. The mold body 902 can be formed from an insulating material such as a molding compound, a resin, epoxy, polymer, or a combination thereof.

The mold body 902 is formed directly on the leadframe 1102 of FIG. 11. The mold body 902 can expose the die paddle 904 and the top side of the side solderable lead 918.

Figure 13:
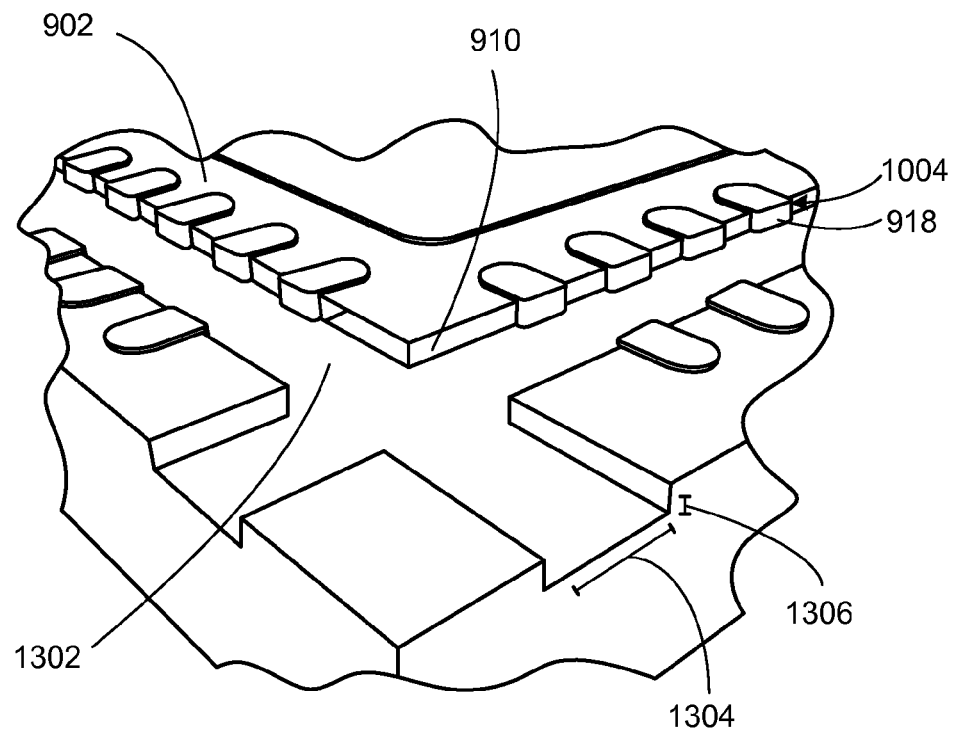
FIG. 13 is the structure of FIG. 12 in a removal phase of manufacturing.

Referring now to FIG. 13, therein is shown the structure of FIG. 12 in a removal phase of manufacturing. The removal phase can include a removal method to form a mold groove 1302 in the mold body 902 and to shape and expose the side solderable lead 918 and the lead protrusion 1004.

The mold groove 1302 is an opening in the mold body 902. The mold groove 1302 can be formed between two directly adjacent rows of the side solderable lead 918 on the leadframe 1102 of FIG. 11.

The mold groove 1302 can have a groove width 1304. The groove width 1304 can be the distance between the opposite sides of the mold groove 1302. The groove width 1304 can be the distance between facing surfaces of adjacent rows of the side solderable lead 918.

The mold groove 1302 can have a groove depth 1306. The groove depth 1306 is a value indicating how far into the mold body 902 the mold groove 1302 extends. The mold groove 1302 can be configured such that the groove depth 1306 is sufficient to expose the upper portions of the side solderable lead 918 but not expose the half-etched lead portion 916 of FIG. 9. For example, the laser ablation removal method can have a laser ablation depth target of 75-125 micrometers (μm).

The mold groove 1302 can form the upper perimeter side 910 and the mold step 906 of FIG. 9. The mold groove 1302 can be formed having depth equal to the mold step height 922 of FIG. 9. The mold groove 1302 can be formed with a single channel, double channels, or a combination thereof. The mold groove 1302 can include a double channel having a central divider.

The mold groove 1302 is formed by removing a portion of the mold body 902 to expose a portion of the side solderable lead 918. The side solderable lead 918 can be exposed on the upper perimeter side 910 of the mold body 902.

Forming the mold groove 1302 can also include removing a portion of the side solderable lead 918. Forming the mold groove 1302 can include shaping a portion of the side solderable lead 918.

The mold groove 1302 can be formed in a variety of ways. For example, the mold groove 1302 can be formed by laser ablation, etching, or a combination thereof.

The removal method of laser ablation can direct a laser along a path to selectively ablate portions of the mold body 902 to form the mold groove 1302. The laser can remove portions of the mold body 902 and portions of the side solderable lead 918.

The mold groove 1302 can have the physical characteristics of being formed by laser ablation including burn marks, melted portions, sputter marks, or combination thereof. Forming the mold groove 1302 by laser ablation can provide a surface that is more uniform and smoother than other methods. The fine grain control of laser beam size, intensity, optical frequency, pulse width, and positional control, laser ablation can form the mold groove 1302 with the desired properties and physical configuration.

The laser can make one or more passes along the path over the mold body 902 to form the mold groove 1302. For example, the laser having a beam diameter can form the mold groove 1302 in a single pass between adjacent rows of the side solderable lead 918 of the leadframe 1102 resulting in a single groove pattern. In another example, the laser can make two passes along the facing sides of adjacent rows of the side solderable lead 918 to form the mold groove 1302 having a double channel. The double channel configuration can include a central spine between the double channels.

Forming the mold groove 1302 and exposing the side solderable lead 918 can be performed in a variety of ways. For example, the laser ablation removal method can employ a laser, such as a green laser (532 nanometer (nm) wavelength), an infrared laser, or other laser wavelength type. The laser can have a power intensity of approximately 9 watts (W).

The laser ablation removal method can employ a variety of configurations. For example, the laser can have a beam width of 0.05 millimeters (mm) when forming the mold groove 1302 and a beam width of 0.08 mm when forming the mold groove 1302 and the side solderable lead 918. In another example, the laser can have a beam width of 0.16 mm when forming the mold groove 1302 and a beam width of 0.08 mm when forming the mold groove 1302 and the side solderable lead 918.

The laser ablation removal method can shape and expose side solderable lead 918 by selectively removing portions of the side solderable lead 918. The path of the laser can include one or more passes along the top edge of the side solderable lead 918 to ablate portions of the side solderable lead 918 for forming the side solderable lead 918 and the lead protrusion 1004. For example, the laser can be directed at the lead protrusion 1004 of the side solderable lead 918 to form the convex shape of the lead protrusion 1004.

The laser ablation removal method can form the shape of the side solderable lead 918. For example, the lead protrusion 1004 extending over the mold step 906 can be rounded, three-sided, angular, or a combination thereof. The laser ablation removal method can be configured to provide the desired shape of the side solderable lead 918 and the lead protrusion 1004.

The mold body 902 and the side solderable lead 918 have different physical properties, so the laser can be configured differently for forming the mold groove 1302 and exposing the side solderable lead 918. For example, the laser can employ different power intensities, pulse modulation, beam size, repetition pattern, or a combination thereof when exposing and shaping the side solderable lead 918 than when forming other portions of the mold groove 1302. In another example, the laser ablation process can be simplified and use the same laser configuration for forming the mold groove 1302 and the side solderable lead 918.

The side solderable lead 918 can have the physical characteristics of being formed by laser ablation including burn marks, melted portions, sputter marks, or combination thereof. Shaping the side solderable lead 918 by laser ablation can provide a surface that is more uniform and smoother than other methods.

Because of the fine grain control of laser beam size, intensity, optical frequency, pulse width, and positional control, laser ablation can more expose and shape the side solderable lead 918 with the desired properties and physical configuration. For example, the laser can shape the lead protrusion 1004 of the side solderable lead 918 to have a rounded convex protrusion for increasing the surface area of the side solderable lead 918 for improved connectivity and making more resilient solder connections.

It has been discovered that forming the mold groove 1302 and the side solderable lead 918 with laser ablation provides increased reliability. The laser ablation process can form the mold groove 1302 and the side solderable lead 918 without mechanical vibration and reduce the likelihood of component failure or physical damage due to vibration.

It has been discovered that forming the mold groove 1302 and the side solderable lead 918 with laser ablation provides simplifies manufacturing and increases flexibility. The precise patterning provided by the laser ablation can form the mold groove 1302 and the side solderable lead 918 having the desired shape by controlling the laser ablation parameters including path, intensity, beam size, and pulse modulation.

It has been discovered that forming the mold groove 1302, the side solderable lead 918, and the lead protrusion 1004 with laser ablation provides simplifies manufacturing and increased yields. The laser ablation can form the mold groove 1302, expose the side solderable lead 918, and form the lead protrusion 1004 in a single operation, thus reducing complexity.

It has been discovered that forming the side solderable lead 918 and the lead protrusion 1004 with laser ablation provides improved reliability and increased yields. The laser ablation can form the lead protrusion 1004 of the side solderable lead 918 with different convex shapes to increase the surface area available for forming a solder connection to increase conductivity and reduce the likelihood of joint failure.

Figure 14:
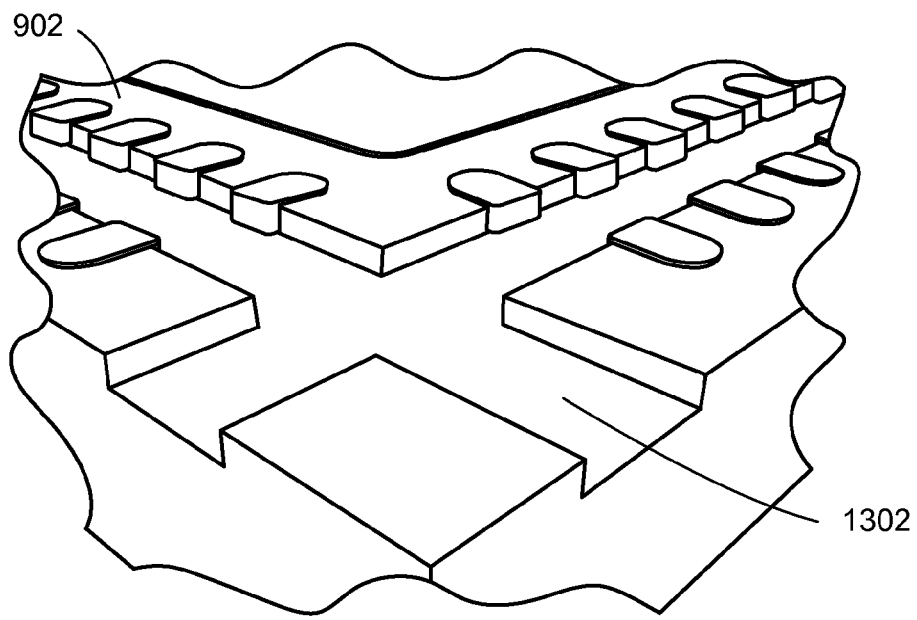
FIG. 14 is the structure of FIG. 13 in a cleaning phase of manufacturing.

Referring now to FIG. 14, therein is shown the structure of FIG. 13 in a cleaning phase of manufacturing. The cleaning phase can include a cleaning method to remove unwanted material resulting from the removal phase. The mold groove 1302 can include the single channel or double channel configuration.

The cleaning phase can include a chemical deflash process to clean away and substantially remove residue from the removal process including spurs, ash, burrs, protrusions, or a combination thereof left in the mold groove 1302. The chemical deflash process is a chemical cleaning and etching process for removing residue and smoothing the surface of the mold groove 1302. For example, the chemical deflash process can remove small structural residue elements formed during the formation of the mold groove 1302. The chemical deflash process can include solvents and high pressure liquid flow to remove the residue.

In an illustrative example, the laser ablation process can remove the resin component of the encapsulation molding compound forming the mold body 902 and leave portions of the encapsulation molding compound filler material. The chemical deflash process can substantially remove the remaining filler material.

Figure 15:
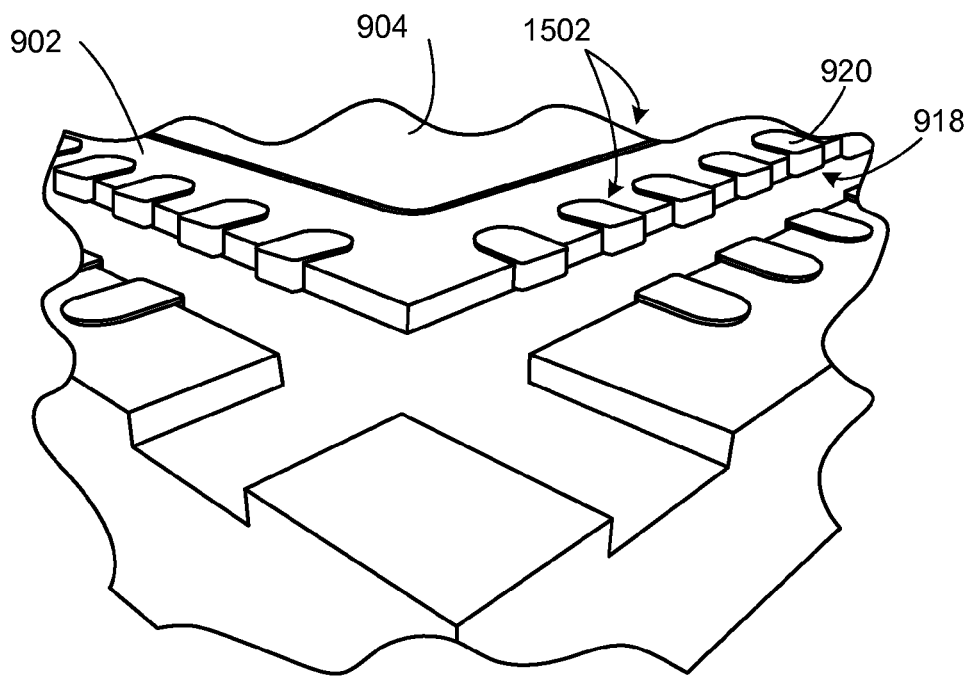
FIG. 15 is the structure of FIG. 14 in a plating phase of manufacturing.

Referring now to FIG. 15, therein is shown the structure of FIG. 14 in a plating phase of manufacturing. The plating phase can include a plating method to form a conductive layer on exposed surfaces of the side solderable lead 918 and the die paddle 904. The conductive layer can be formed on the side solderable lead 918, the lead top side 920, and the die paddle 904.

For example, the plating phase can form a plating layer 1502 on all exposed copper surfaces exposed from the mold body 902. The plating layer 1502 can be a conductive protective material for preventing corrosion, reducing ion migration, increasing conductivity, or a combination thereof.

Figure 16:
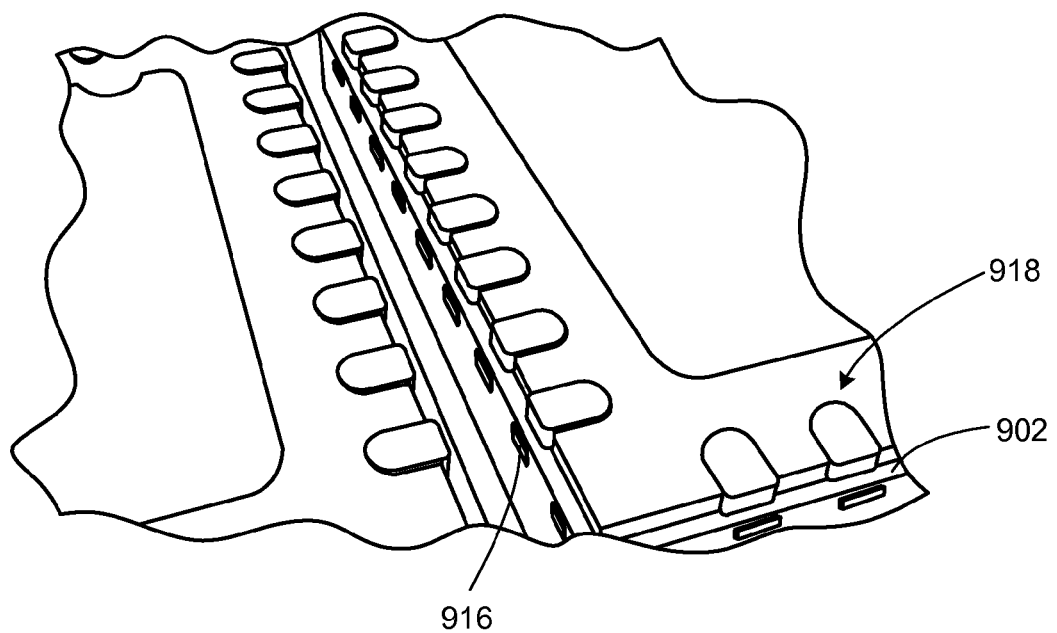
FIG. 16 is the structure of FIG. 15 in a singulation phase of manufacturing.

Referring now to FIG. 16, therein is shown the structure of FIG. 15 in a singulation phase of manufacturing. The singulation phase can include a singulation method to separate the integrated circuit packaging system 900 of FIG. 9 from an adjacent one of the integrated circuit packaging system 900.

The singulation method can separate the integrated circuit packaging system 900 from another of the integrated circuit packaging system 900 by cutting along the mold groove 1302 of FIG. 13. The singulation method can expose the half-etched lead portion 916 of the side solderable lead 918 by cutting through the leadframe 1102 of FIG. 11 including the dambar 1104 of FIG. 11.

The singulation method can be implemented in a variety of ways. For example, the singulation method can include sawing, grinding, etching, ablating, or a combination thereof. In another example, the singulation method can include using a saw to cut through the middle portion of the mold groove 1302. In yet another example, the singulation method can include using a laser cutter to remove the middle portion of the mold groove 1302.

Singulating along the mold groove 1302 of FIG. 13 can expose the half-etched lead portion 916 of the side solderable lead 918. The half-etched lead portion 916 can have the physical characteristics of being singulated. Singulating along the mold groove 1302 forms the mold step 902.

For example, the half-etched lead portion 916 can include the physical characteristics of sawing including scratches aligned along the direction of motion of the saw, burrs, spurs, or a combination thereof. In another example, the half-etched lead portion 916 can have the physical characteristics of laser cutting including burn marks, spurs, protrusions, melted portions, or a combination thereof.

It has been discovered that forming the mold groove 1302 with laser ablation improves singulation and helps reduce manufacturing errors. Forming the mold groove 1302 simplifies package singulation by providing a guide for the singulation process.

Figure 17:
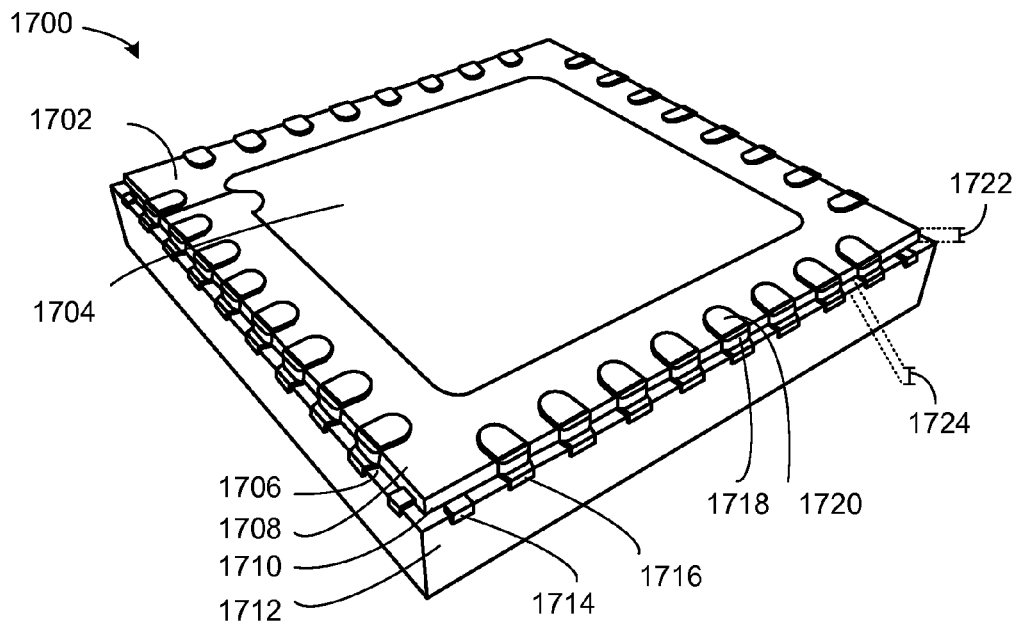
FIG. 17 is an isometric view of an integrated circuit packaging system in a third embodiment of the present invention.

Referring now to FIG. 17, therein is shown an isometric view of an integrated circuit packaging system 1700 in a third embodiment of the present invention. The integrated circuit packaging system 1700 can include a mold body 1702 and a die paddle 1704. For example, the integrated circuit packaging system 1700 can include a Quad Flat No Lead (QFN) package, a Quad Flat No Lead side solderable (QFNs-ss) package, or other similar package.

The mold body 1702 is a structural support element. The mold body 1702 can be formed from a molding compound, epoxy, resin, polymer, or a combination thereof.

The die paddle 1704 is a structural element for supporting a die (not shown). The die paddle 1704 can be formed from a metal, alloy, or a combination thereof. The die paddle 1704 can be thermally conductive for dissipating heat generated by the die.

The mold body 1702 can include a mold step 1706. The mold step 1706 is a structural element. The mold step 1706 can be formed by removing a portion of the mold body 1702 around the top perimeter of the mold body 1702.

The mold body 1702 can include a mold body top side 1708. The perimeter of the mold body top side 1708 is set back from the lower portion of the mold body 1702.

The mold body top side 1708 is coplanar with the top side of the die paddle 1704. The die paddle 1704 is exposed from the mold body 1702 at the mold body top side 1708.

The mold body 1702 can include an upper perimeter side 1710. The upper perimeter side 1710 is the non-horizontal side of the upper portion of the mold body 1702. The mold body 1702 can include a lower perimeter side 1712. The lower perimeter side 1712 is the non-horizontal die of the lower portion of the mold body 1702. The lower perimeter side 1712 is separated from the upper perimeter side 1710 by the mold step 1706.

The upper perimeter side 1710 is separated from the mold step 1706 by a mold step height 1722. The upper perimeter side 1710 is set back from the lower perimeter side 1712 by a mold step width 1724.

The integrated circuit packaging system 1700 can include a side dambar lead 1714. The side dambar lead 1714 is a conductive structure exposed on the lower perimeter side 1712.

The integrated circuit packaging system 1700 can include a half-etched lead portion 1716. The half-etched lead portion 1716 is a conductive element exposed on the lower perimeter side 1712. The half-etched lead portion 1716 is a part of the side solderable lead 1718. The side solderable lead 1716 and the half-etched lead portion 1718 are exposed from the mold body 1702 at the mold step 1706. The half-etched lead portion 1718 is exposed on the lower perimeter side 1712 of the mold body 1702.

The integrated circuit packaging system 1700 can include a side solderable lead 1718. The side solderable lead 1718 is an electrical conductor for forming a conductive path to an external element (not shown). The side solderable lead 1718 can extend out from the upper perimeter side 1710 and onto the mold step 1706. The side solderable lead 1718 can provide an electrical connection in the horizontal direction.

The side solderable lead 1718 can include a lead top side 1720. The lead top side 1720 is the top side of the side solderable lead 1718. The lead top side 1720 is exposed on the mold body top side 1708 and coplanar with the mold body top side 1708. The lead top side 1720 provides a conductive contact at the mold body top side 1708.

It has been found that forming the side solderable lead 1718 on the upper perimeter side 1710 of the mold body 1702 increases and simplifies connectivity. The side solderable lead 1718 having the lead top side 1720 exposed on the mold body top side 1708 provide additional surface area for forming solder connections for increasing connectivity.

It has been found that forming the mold step 1706 adjacent to the side solderable lead 1718 can increase manufacturing yield and reduce short circuits. The mold step 1706 can prevent the flow of solder from the side solderable lead 1718 by providing a platform to support the solder connection to the side solderable lead 1718.

It has been found that forming the side dambar lead 1714 on the lower perimeter side 1710 can increase operational performance. The side dambar lead 1714 can provide a path for providing power or ground voltages. The side dambar lead 1714 can provide a thermal connection for dissipating heat to an external system.

Figure 18:
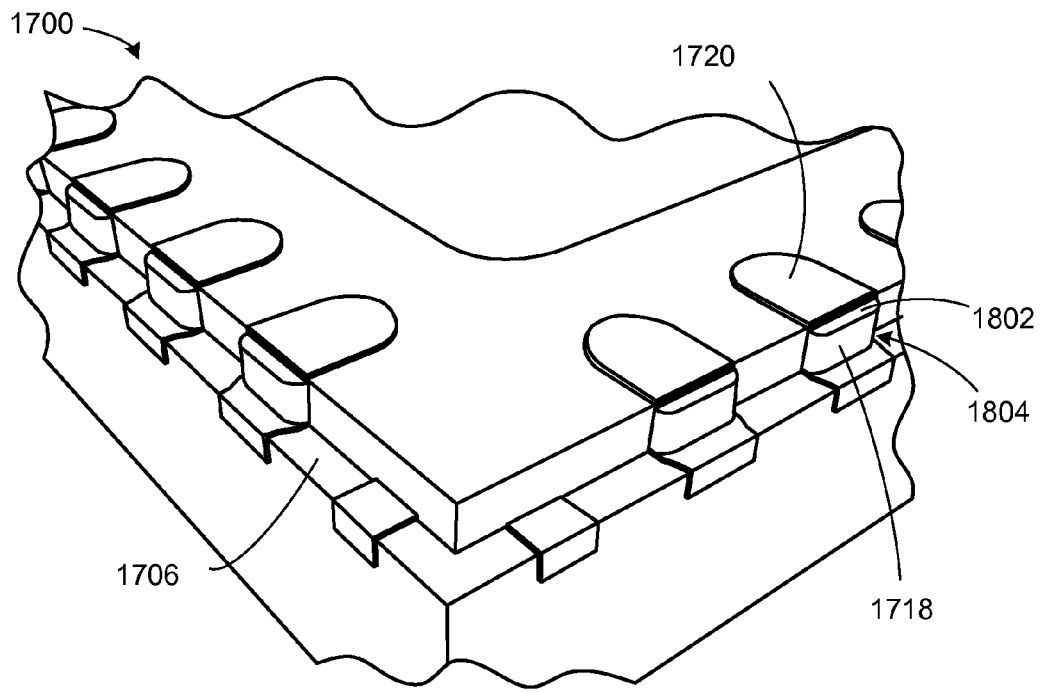
FIG. 18 is a close up view of the integrated circuit packaging system of FIG. 17.

Referring now to FIG. 18, therein is shown a close up view of the integrated circuit packaging system of FIG. 17. The integrated circuit packaging system 1700 can include the side solderable lead 1718.

The side solderable lead 1718 can include a lead step 1802 in a lead protrusion 1804. The lead protrusion 1804 is a portion of the side solderable lead 1718 extending over the mold step 1706 to provide lateral connectivity. For example, the lead protrusion 1804 can form a side solder connection with an external system (not shown)

The lead step 1802 is a portion of the side solderable lead 1718 set back from the lead top side 1720. The lead step 1802 can provide additional surface area for forming a solder connection at the lead protrusion 1804 of the side solderable lead 1718. The lead step 1802 is at the top of the lead protrusion 1804.

It has been discovered that forming the lead step 1802 on the lead protrusion 1804 of the side solderable lead 1718 increases the conductivity of the connection to the side solderable lead 1718. Forming the lead step 1802 on the side solderable lead 1718 increases the amount of surface area for forming a solder connection on the side solderable lead 1718 and increases the overall conductivity of the solder connection.

Figure 19:
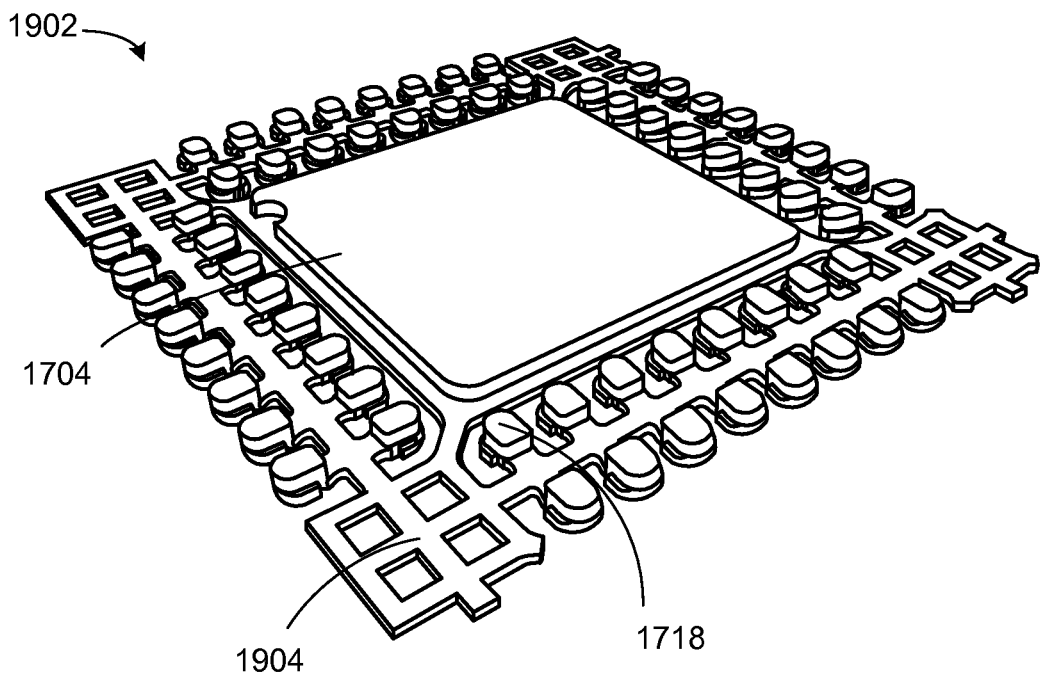
FIG. 19 is the structure of FIG. 17 in a provisioning phase of manufacturing.

Referring now to FIG. 19, therein is shown the structure of FIG. 17 in a provisioning phase of manufacturing. The provisioning phase can include a forming method to form a leadframe 1902. The leadframe 1902 is a structure having conductive elements. The leadframe 1902 can include the die paddle 1704 coupled to a dambar 1904 and the side solderable lead 1718. The dambar 1904 is a conductive structural element. For example, the leadframe 1902 can be formed with copper, tin, gold, other metals, alloys, or a combination thereof.

Figure 20:
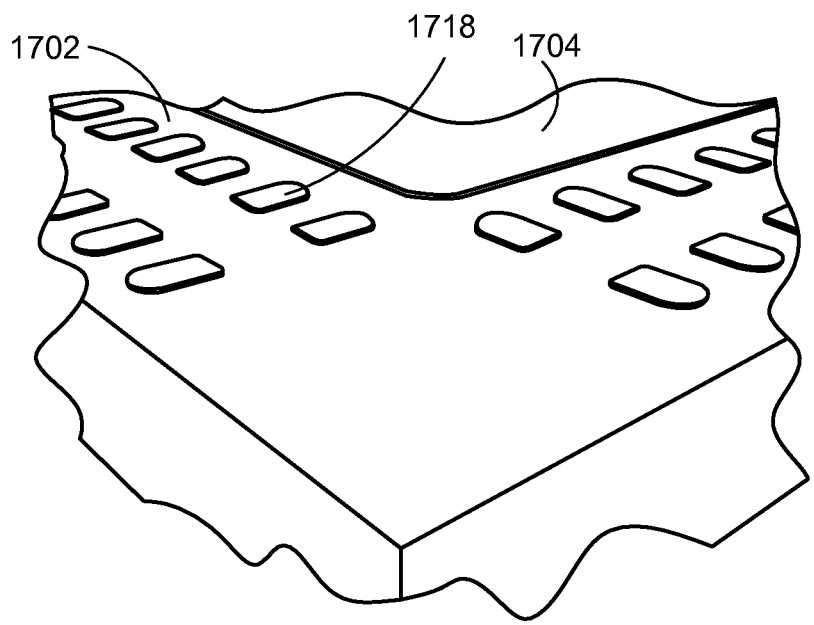
FIG. 20 is the structure of FIG. 19 in a molding phase of manufacturing.

Referring now to FIG. 20, therein is shown the structure of FIG. 19 in a molding phase of manufacturing. The molding phase can include a molding method to form the mold body 1702. The mold body 1702 can be formed from an insulating material such as a molding compound, a resin, epoxy, polymer, or a combination thereof.

The mold body 1702 is formed directly on the leadframe 1902 of FIG. 19. The mold body 1702 can expose the die paddle 1704 and the top side of the side solderable lead 1718.

Figure 21:
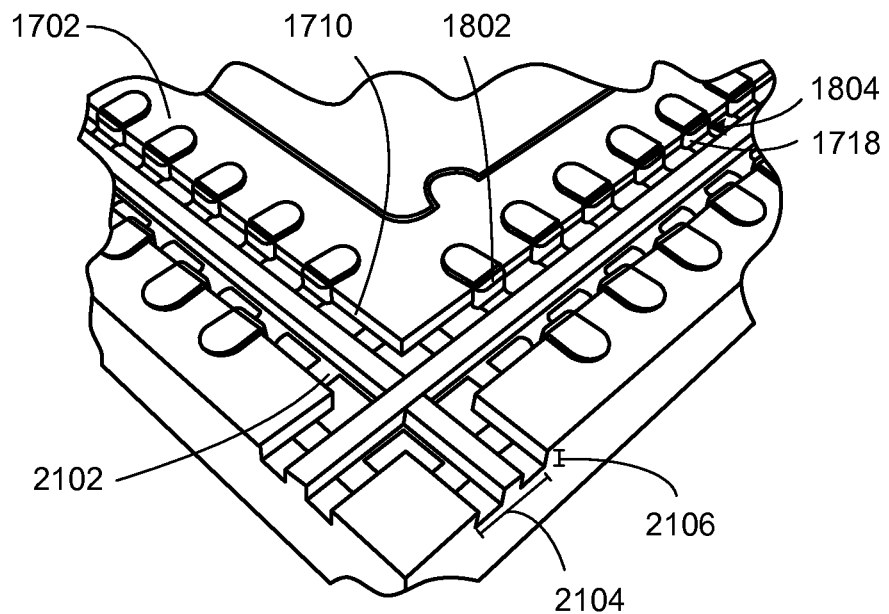
FIG. 21 is the structure of FIG. 20 in a removal phase of manufacturing.

Referring now to FIG. 21, therein is shown the structure of FIG. 20 in a removal phase of manufacturing. The removal phase can include a removal method to form a mold groove 2102 in the mold body 1702 and to shape and expose the side solderable lead 1718 and the lead protrusion 1804.

The mold groove 2102 is an opening in the mold body 1702. The mold groove 2102 can be formed between two directly adjacent rows of the side solderable lead 1718 on the leadframe 1902 of FIG. 19.

The mold groove 2102 can have a groove width 2104. The groove width 2104 can be the distance between the opposite sides of the mold groove 2102. The groove width 2104 can be the distance between facing surfaces of adjacent rows of the side solderable lead 1718.

The mold groove 2102 can have a groove depth 2106. The groove depth 2106 is a value indicating how far into the mold body 1702 the mold groove 2102 extends. The mold groove 2102 can be configured such that the groove depth 2106 is sufficient to expose the upper portions of the side solderable lead 1718 and the half-etched lead portion 1716 of FIG. 17. For example, the laser ablation removal method can have a laser ablation depth target of 75-125 micrometers (μm).

The mold groove 2102 can form the upper perimeter side 1710 and the mold step 1706 of FIG. 17. The mold groove 2102 can be formed having depth equal to the mold step height 1722 of FIG. 17. The mold groove 2102 can be formed with a single channel, double channels, or a combination thereof. The mold groove 2102 can include a double channel having a central divider.

The mold groove 2102 is formed by removing a portion of the mold body 1702 to expose a portion of the side solderable lead 1718 including the half-etched lead portion 1716. The side solderable lead 1718 can be exposed on the upper perimeter side 1710 of the mold body 1702.

Forming the mold groove 2102 can also include removing a portion of the side solderable lead 1718. Forming the mold groove 2102 can include shaping a portion of the side solderable lead 1718.

The mold groove 2102 can be formed in a variety of ways. For example, the mold groove 2102 can be formed by laser ablation, etching, or a combination thereof.

The removal method of laser ablation can direct a laser along a path to selectively ablate portions of the mold body 1702 to form the mold groove 2102. The laser can remove portions of the mold body 1702 and portions of the side solderable lead 1718.

The mold groove 2102 can have the physical characteristics of being formed by laser ablation including burn marks, melted portions, sputter marks, or combination thereof. Forming the mold groove 2102 by laser ablation can provide a surface that is more uniform and smoother than other methods. The fine grain control of laser beam size, intensity, optical frequency, pulse width, and positional control, laser ablation can form the mold groove 2102 with the desired properties and physical configuration.

The laser can make one or more passes along the path over the mold body 1702 to form the mold groove 2102. For example, the laser having a beam diameter can form the mold groove 2102 in a single pass between adjacent rows of the side solderable lead 1718 of the leadframe 1902 resulting in a single groove pattern. In another example, the laser can make two passes along the facing sides of adjacent rows of the side solderable lead 1718 to form the mold groove 2102 having a double channel. The double channel configuration can include a central spine between the double channels.

Forming the mold groove 2102 and exposing the side solderable lead 1718 can be performed in a variety of ways. For example, the laser ablation removal method can employ a laser, such as a green laser (532 nanometer (nm) wavelength), an infrared laser, or other laser wavelength type. The laser can have a power intensity of approximately 9 watts (W).

The laser ablation removal method can employ a variety of configurations. For example, the laser can have a beam width of 0.05 millimeters (mm) when forming the mold groove 2102 and a beam width of 0.08 mm when forming the mold groove 2102 and the side solderable lead 1718. In another example, the laser can have a beam width of 0.16 mm when forming the mold groove 2102 and a beam width of 0.08 mm when forming the mold groove 2102 and the side solderable lead 1718.

The laser ablation removal method can shape and expose the side solderable lead 1718 by selectively removing portions of the side solderable lead 1718. The path of the laser can include one or more passes along the top edge of the side solderable lead 1718 to ablate portions of the side solderable lead 1718 for forming the side solderable lead 1718 and the lead step 1802 on the lead protrusion 1804. For example, the laser can be directed at the top edge of the lead protrusion 1804 of the side solderable lead 1718 to form the lead step 1802 with an offset from top of the side solderable lead 1718.

The laser ablation removal method can form the shape of the side solderable lead 1718. For example, the lead protrusion 1804 extending over the mold step 1706 can be rounded, three-sided, angular, or a combination thereof. The laser ablation removal method can be configured to provide the desired shape of the side solderable lead 1718 and the lead protrusion 1804.

The mold body 1702 and the side solderable lead 1718 have different physical properties, so the laser can be configured differently for forming the mold groove 2102 and exposing the side solderable lead 1718. For example, the laser can employ different power intensities, pulse modulation, beam size, repetition pattern, or a combination thereof when exposing and shaping the side solderable lead 1718 than when forming other portions of the mold groove 2102. In another example, the laser ablation process can be simplified and use the same laser configuration for forming the mold groove 2102 and the side solderable lead 1718.

The side solderable lead 1718 can have the physical characteristics of being formed by laser ablation including burn marks, melted portions, sputter marks, or combination thereof. Shaping the side solderable lead 1718 by laser ablation can provide a surface that is more uniform and smoother than other methods.

Because of the fine grain control of laser beam size, intensity, optical frequency, pulse width, and positional control, laser ablation can more expose and shape the side solderable lead 1718 with the desired properties and physical configuration. For example, the laser can shape the lead protrusion 1804 of the side solderable lead 1718 to have a rounded convex protrusion for increasing the surface area of the side solderable lead 1718 for improved connectivity and making more resilient solder connections.

It has been discovered that forming the mold groove 2102 and the side solderable lead 1718 with laser ablation provides increased reliability. The laser ablation process can form the mold groove 2102 and the side solderable lead 1718 without mechanical vibration and reduce the likelihood of component failure or physical damage due to vibration.

It has been discovered that forming the mold groove 2102 and the side solderable lead 1718 with laser ablation provides simplifies manufacturing and increases flexibility. The precise patterning provided by the laser ablation can form the mold groove 2102 and the side solderable lead 1718 having the desired shape by controlling the laser ablation parameters including path, intensity, beam size, and pulse modulation.

It has been discovered that forming the mold groove 2102, the side solderable lead 1718, the half-etched lead portion 1716, and the lead step 1802 with laser ablation provides simplified manufacturing and increased yields. The laser ablation can form the mold groove 2102, expose the side solderable lead 1718 and the top side of the half-etched lead portion 1716, and form the lead step 1802 in a single operation, thus reducing complexity.

It has been discovered that forming the side solderable lead 1718 and the lead protrusion 1804 with laser ablation provides improved reliability and increased yields. The laser ablation can form the lead protrusion 1804 of the side solderable lead 1718 with different convex shapes to increase the surface area available for forming a solder connection to increase conductivity and reduce the likelihood of joint failure.

Figure 22:
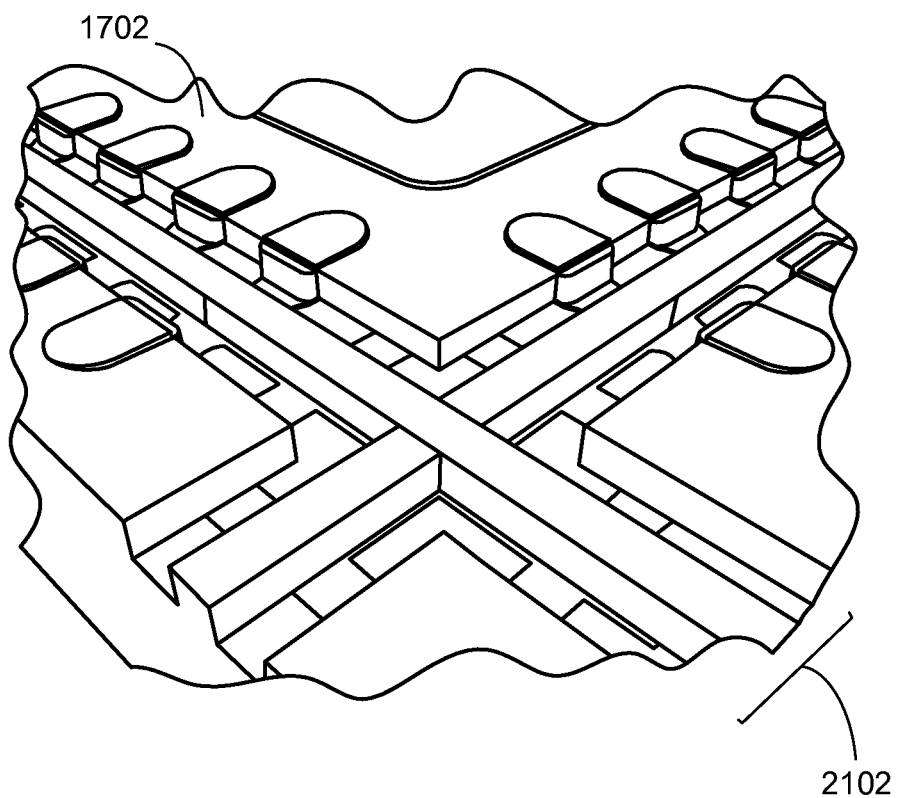
FIG. 22 is the structure of FIG. 21 in a cleaning phase of manufacturing.

Referring now to FIG. 22, therein is shown the structure of FIG. 21 in a cleaning phase of manufacturing. The cleaning phase can include a cleaning method to remove unwanted material resulting from the removal phase. The mold groove 2102 can include the single channel or double channel configuration.

The cleaning phase can include a chemical deflash process to clean away and substantially remove residue from the removal process including spurs, ash, burrs, protrusions, or a combination thereof left in the mold groove 2102. The chemical deflash process is a chemical cleaning and etching process for removing residue and smoothing the surface of the mold groove 2102. For example, the chemical deflash process can remove small structural residue elements formed during the formation of the mold groove 2102. The chemical deflash process can include solvents and high pressure liquid flow to remove the residue.

In an illustrative example, the laser ablation process can remove the resin component of the encapsulation molding compound forming the mold body 1702 and leave portions of the encapsulation molding compound filler material. The chemical deflash process can substantially remove the remaining filler material.

Figure 23:
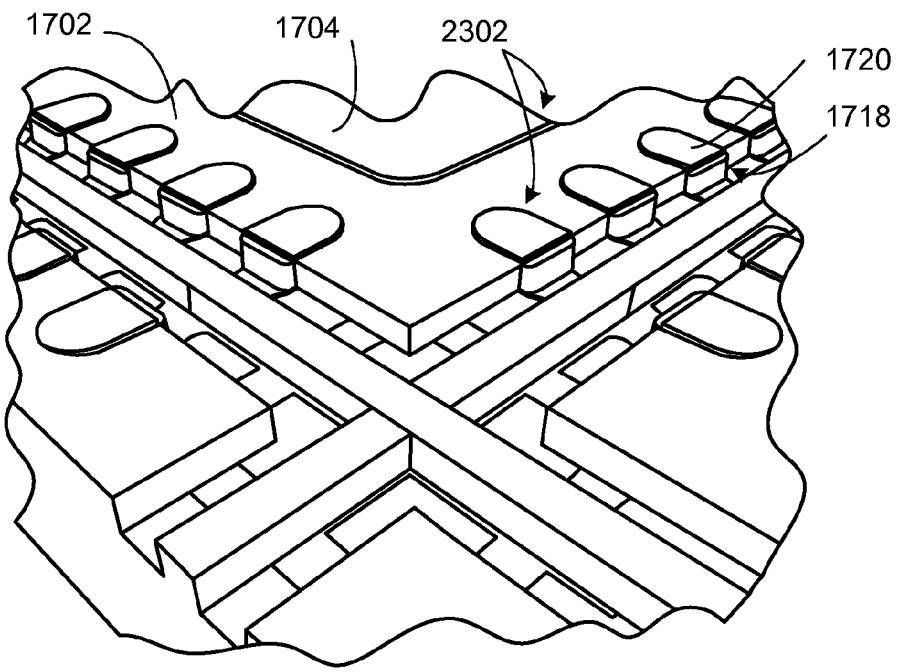
FIG. 23 is the structure of FIG. 22 in a plating phase of manufacturing.

Referring now to FIG. 23, therein is shown the structure of FIG. 22 in a plating phase of manufacturing. The plating phase can include a plating method to form a conductive layer on exposed surfaces of the side solderable lead 1718 and the die paddle 1704. The conductive layer can be formed on the side solderable lead 1718, the lead top side 1720, and the die paddle 1704.

For example, the plating phase can form a plating layer 2302 on all exposed copper surfaces exposed from the mold body 1702. The plating layer 2302 can be a conductive protective material for preventing corrosion, reducing ion migration, increasing conductivity, or a combination thereof.

Figure 24:
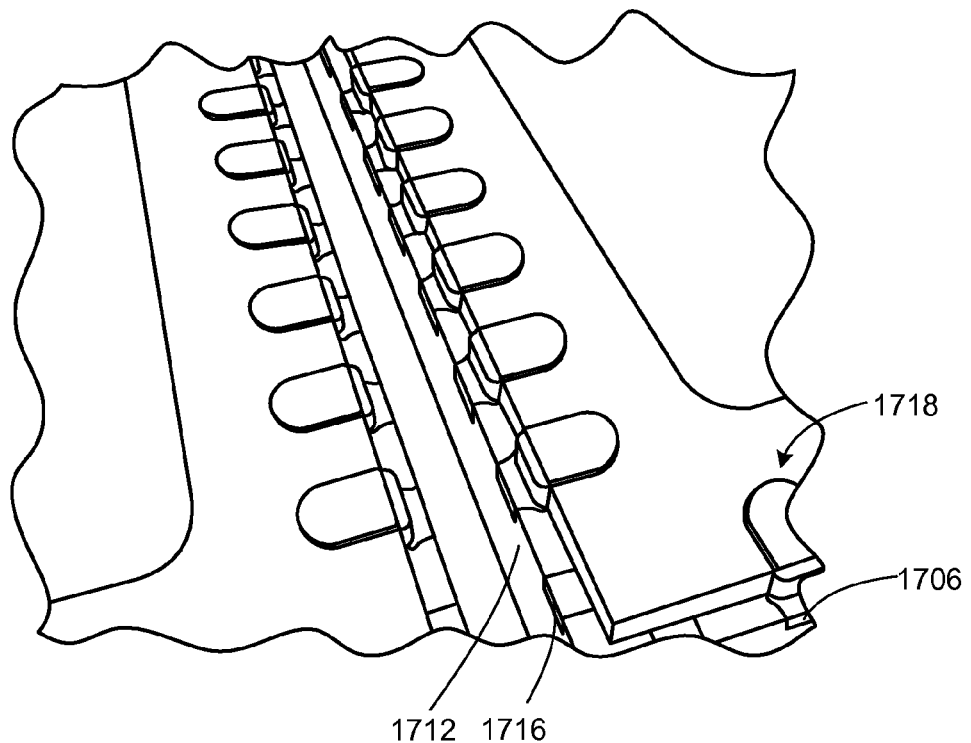
FIG. 24 is the structure of FIG. 23 in a singulation phase of manufacturing.

Referring now to FIG. 24, therein is shown the structure of FIG. 23 in a singulation phase of manufacturing. The singulation phase can include a singulation method to separate the integrated circuit packaging system 1700 of FIG. 17 from an adjacent one of the integrated circuit packaging system 1700.

The singulation method can separate the integrated circuit packaging system 1700 from another of the integrated circuit packaging system 1700 by cutting along the mold groove 2102 of FIG. 21. The singulation method can expose the half-etched lead portion 1716 of the side solderable lead 1718 by cutting through the leadframe 1902 of FIG. 19 including the dambar 1904 of FIG. 19.

The singulation method can be implemented in a variety of ways. For example, the singulation method can include sawing, grinding, etching, ablating, or a combination thereof. In another example, the singulation method can include using a saw to cut through the middle portion of the mold groove 2102. In yet another example, the singulation method can include using a laser cutter to remove the middle portion of the mold groove 2102.

Singulating along the mold groove 2102 of FIG. 21 can expose the half-etched lead portion 1716 of the side solderable lead 1718 on the lower perimeter side 1712. The half-etched lead portion 1716 can have the physical characteristics of being singulated. Singulating along the mold groove 2102 forms the mold step 1706.

For example, the half-etched lead portion 1716 can include the physical characteristics of sawing including scratches aligned along the direction of motion of the saw, burrs, spurs, or a combination thereof. In another example, the half-etched lead portion 1716 can have the physical characteristics of laser cutting including burn marks, spurs, protrusions, melted portions, or a combination thereof.

It has been discovered that forming the mold groove 2102 with laser ablation improves singulation and helps reduce manufacturing errors. Forming the mold groove 2102 simplifies package singulation by providing a guide for the singulation process.

Figure 25:
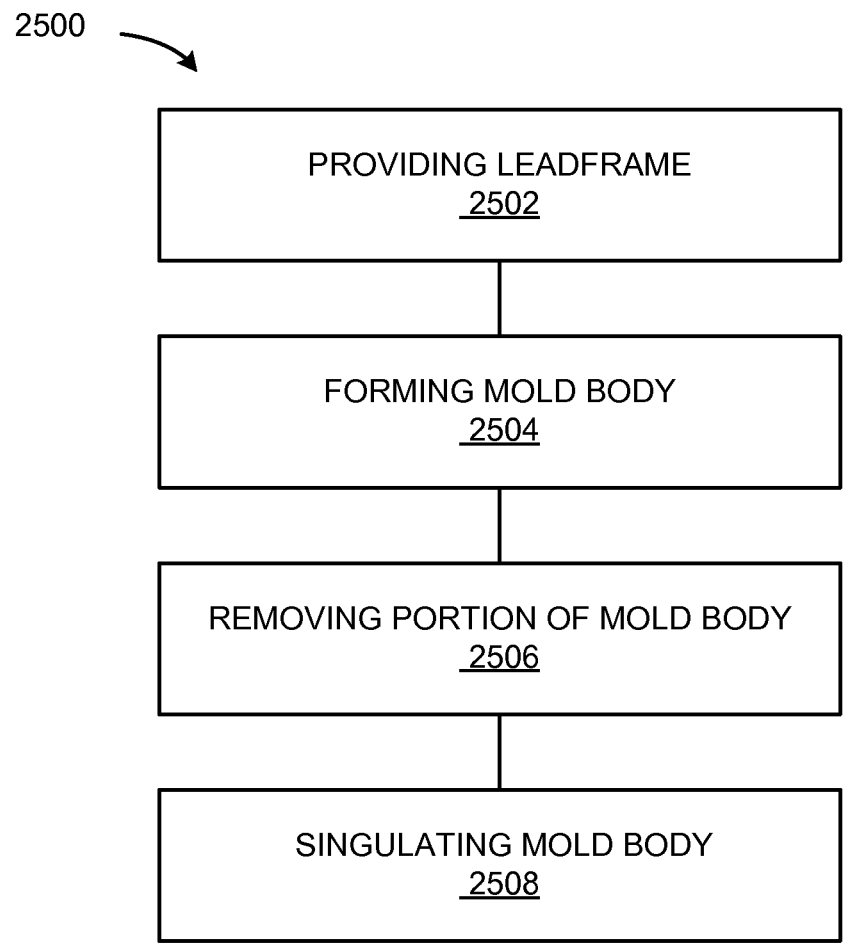
FIG. 25 is a flow chart of a method of manufacture of an integrated circuit packaging system in a further embodiment of the present invention.

Referring now to FIG. 25, therein is shown a flow chart of a method 2500 of manufacture of an integrated circuit packaging system in a further embodiment of the present invention. The method 2500 includes: providing a leadframe having a side solderable lead with a half-etched lead portion and a lead top side in a block 2502; forming a mold body directly on the leadframe and the side solderable lead, the lead top side of the side solderable lead exposed from the mold body in a block 2504; removing a portion of the mold body and a portion of the side solderable lead for forming a mold groove in the mold body to expose a lead protrusion of the side solderable lead on an upper perimeter side of the mold body in a block 2506; and singulating the mold body and the leadframe for exposing the half-etching lead portion from a lower perimeter side of the mold body in a block 2508.

Thus, it has been discovered that the integrated circuit packaging system of the present invention furnishes important and heretofore unknown and unavailable solutions, capabilities, and functional aspects for an integrated circuit packaging system. The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit packaging systems fully compatible with conventional manufacturing methods or processes and technologies.

Another important aspect of the present invention is that it valuably supports and services the historical trend of reducing costs, simplifying systems, and increasing performance. These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hitherto set forth herein or shown in the accompanying drawings are to be interpreted in an illustrative and non-limiting sense.

What is claimed is:

1. A method of manufacture of an integrated circuit packaging system comprising:
    providing a leadframe having a side solderable lead with a half-etched lead portion and a lead top side;
    forming a mold body directly on the leadframe and the side solderable lead, the lead top side of the side solderable lead exposed from the mold body;
    removing a portion of the mold body and a portion of the side solderable lead for forming a mold groove in the mold body to expose a lead protrusion of the side solderable lead on an upper perimeter side of the mold body; and
    singulating the mold body and the leadframe for exposing the half-etched lead portion from a lower perimeter side of the mold body.

2. The method as claimed in claim 1 wherein removing a portion of the mold body includes forming the lead protrusion extending over the mold groove.

3. The method as claimed in claim 1 wherein removing a portion of the side solderable lead includes forming a lead step in the lead protrusion.

4. The method as claimed in claim 1 wherein removing a portion of the mold body includes exposing the side solderable lead and the half-etched lead portion at the mold step.

5. The method as claimed in claim 1 wherein removing a portion of the mold groove includes chemically deflashing the mold groove for removing residue.

6. A method of manufacture of an integrated circuit packaging system comprising:
    providing a leadframe having a die paddle and a side solderable lead with a half-etched lead portion and a lead top side;
    forming a mold body directly on the leadframe, the die paddle, and the side solderable lead with the lead top side of the side solderable lead exposed from the mold body;
    removing a portion of the mold body and a portion of the side solderable lead using laser ablation for forming a mold groove in the mold body to expose a lead protrusion of the side solderable lead on an upper perimeter side of the mold body; and
    singulating the mold body and the leadframe for exposing the half-etched lead portion from a lower perimeter side of the mold body.

7. The method as claimed in claim 6 wherein removing a portion of the mold body includes forming the lead protrusion extending over the mold groove.

8. The method as claimed in claim 6 wherein removing a portion of the side solderable lead includes forming a lead step in the lead protrusion.

9. The method as claimed in claim 6 wherein removing a portion of the mold body includes exposing the side solderable lead and the half-etched lead portion at the mold step and on the upper perimeter side of the mold body using a green (532 nm) laser.

10. The method as claimed in claim 6 wherein removing a portion of the mold groove includes chemically deflashing the mold groove for removing residue.

11. An integrated circuit packaging system comprising:
    a leadframe having a side solderable lead with a half-etched lead portion and a lead top side;
    a mold body directly on the leadframe and the side solderable lead, the lead top side of the side solderable lead exposed from the mold body;
    a mold groove in the mold body and in a portion of the side solderable lead for exposing a lead protrusion of the side solderable lead on an upper perimeter side of the mold body; and the half-etched lead portion exposed from a lower perimeter side of the mold body.

12. The system as claimed in claim 11 wherein the lead protrusion extends over the mold groove.

13. The system as claimed in claim 11 wherein the lead protrusion includes a lead step formed at the top of the lead protrusion.

14. The system as claimed in claim 11 wherein the side solderable lead and the half-etched lead portion are exposed at the mold step.

15. The system as claimed in claim 11 wherein the mold groove is substantially free of residue.

16. The system as claimed in claim 11 wherein:
the leadframe includes a die paddle;
the mold body directly on the die paddle; and
the mold groove and the side solderable lead have the physical characteristics of laser ablation.

17. The system as claimed in claim 16 wherein the lead protrusion extends over the mold groove.

18. The system as claimed in claim 16 wherein the side solderable lead includes a lead step in the lead protrusion.

19. The system as claimed in claim 16 wherein the side solderable lead and the half-etched lead portion are exposed at the mold step and on the upper perimeter side of the mold body and have the physical characteristics of laser ablation using a green (532 nm) laser.

20. The system as claimed in claim 16 wherein the mold groove is substantially free of residue.

* * * * *